United States Patent
Lee et al.

(10) Patent No.: US 7,928,441 B2
(45) Date of Patent: Apr. 19, 2011

(54) TFT ARRAY PANEL AND FABRICATING METHOD THEREOF

(75) Inventors: Je-hun Lee, Seoul (KR); Chang-ob Jeong, Gyeonggi-do (KR); Jin-kwan Kim, Gyeonggi-do (KR); Yang-bo Bae, Gyeonggi-do (KR); Beom-seok Cho, Seoul (KR); Jun-hyung Souk, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/417,151

(22) Filed: Apr. 2, 2009

(65) Prior Publication Data
US 2009/0191698 A1 Jul. 30, 2009

Related U.S. Application Data
(62) Division of application No. 11/316,242, filed on Dec. 21, 2005.

(30) Foreign Application Priority Data
Feb. 7, 2005 (KR) .............................. 2005-0011136

(51) Int. Cl.
*H01L 29/04* (2006.01)

(52) U.S. Cl. .................... 257/59; 257/72; 257/E27.001

(58) Field of Classification Search .................. 257/59, 257/72, E27.001
See application file for complete search history.

(56) References Cited

U.S. PATENT DOCUMENTS
| | | | | |
|---|---|---|---|---|
| 6,081,308 | A * | 6/2000 | Jeong et al. | 349/42 |
| 7,173,683 | B2 * | 2/2007 | Hur et al. | 349/147 |
| 2002/0013021 | A1 * | 1/2002 | Jeong et al. | 438/149 |
| 2002/0044228 | A1 * | 4/2002 | Oh et al. | 349/40 |
| 2003/0160252 | A1 * | 8/2003 | Jeong et al. | 257/81 |
| 2004/0140566 | A1 * | 7/2004 | Jeong et al. | 257/764 |

FOREIGN PATENT DOCUMENTS
| | | |
|---|---|---|
| KR | 2000-0003179 | 1/2000 |
| KR | 2002-0328395 | 11/2002 |

* cited by examiner

*Primary Examiner* — Eugene Lee
*Assistant Examiner* — Anthony Ho
(74) *Attorney, Agent, or Firm* — Innovation Counsel LLP

(57) ABSTRACT

Disclosed is display part such as a TFT array panel comprising an aluminum layer, and a molybdenum layer formed on the aluminum layer. The thickness of the molybdenum layer may be about 10% to about 40% the thickness of the aluminum layer. As a result, a top surface of the aluminum layer may have a width about equal to a bottom surface of the molybdenum layer.

Accordingly, it is an aspect of the present invention to provide a TFT array panel comprising an aluminum wiring on which aluminum protrusion is reduced or eliminated.

3 Claims, 46 Drawing Sheets

TFT ARRAY PANEL AND FABRICATING METHOD THEREOF

CROSS-REFERENCE TO RELATED APPLICATIONS

This is a divisional patent application of U.S. patent application Ser. No. 11/316,242, filed Dec. 21, 2005, which claims the benefit of Korean Patent Application No. 2005-0011136, filed on Feb. 7, 2005, in the Korean Intellectual Property Office, the disclosures of which are incorporated herein by reference.

BACKGROUND OF THE INVENTION

1. Field of the Invention

The present invention relates to display device such as a thin film transistor (TFT) array panel and a fabricating method thereof.

2. Description of the Related Art

In a liquid crystal display (LCD), an LCD panel comprises a TFT array panel, a color filter array panel, and liquid crystal sandwiched between the TFT array panel and the color filter array panel. For reference, the LCD panel cannot emit light for itself, so that there is additionally needed a backlight unit. Here, the backlight unit is located behind the TFT array panel and emits light toward the TFT array panel. Further, the transmittance of the light emitted from the backlight unit is adjusted depending on the molecular alignment of the liquid crystal.

Consumer demand for an LCD having a wide screen, high definition and a high aperture ratio has been increasing. As the side of LCD displays increases, the length of the wiring of the LCD is increasing, while the width thereof is decreasing. As a result, resistance values for LCD wiring are increasing. This may result in increased RC delay, which in turn may lead to distortion of displayed images.

Metals such as chrome (Cr), molybdenum-tungsten alloy (MoW) or the like, which have relatively high resistivities (e.g., 10 $\mu\Omega$/cm or more), are commonly used for the wiring material. However, the resistivity of these materials may be prohibitively high for wide-screened LCDs having a size of 20 inch or more. Accordingly, large screen LCDs may require wiring materials having relatively low resistivity.

Examples of lower resistivity materials include silver (Ag), copper (Cu), aluminum (Al), etc. Among these metals, silver and copper have poor adhesion properties with respect to the glass substrate materials used for TFT array panels. Copper and amorphous silicon (which may be used for a semiconductor layer of a TFT) may inter-diffuse, thereby damaging the TFT and lowering the resisitivity of the copper.

Because of shortcomings of silver and copper such as those described above, aluminum is generally used as basic material for the wiring. Aluminum has many merits such as a low resistivity (about 3 $\mu\Omega$/cm), ease of wire formation, low-cost, etc.

However, aluminum has weak corrosion-resistance to chemicals, so that it can be easily oxidized or short-circuited. To make up for the weak corrosion resistance, a double layer aluminum/molybdenum structure may be used, incorporating a molybdenum upper layer. Molybdenum may be used due to its strong corrosion-resistance to the chemicals.

However, a hillock may be formed when forming a double layer aluminum/molybdenum structure.

SUMMARY OF THE INVENTION

Systems and techniques provided herein may allow for formation of a multi-layer structure in which hillock formation is substantially reduced, or eliminated.

Accordingly, it is an aspect of the present disclosure to provide a TFT array panel comprising an aluminum wiring on which a hillock is substantially or completely prevented from growing.

Another aspect of the present disclosure is to provide a method of fabricating a TFT array panel comprising an aluminum wiring on which a hillock is substantially or completely prevented from growing.

Still another aspect of the present disclosure is to provide an LCD comprising an aluminum wiring on which a hillock is substantially or completely prevented from growing.

The foregoing and/or other aspects of the present disclosure can achieved by providing a display part such as a TFT array panel comprising an aluminum layer, and a top molybdenum layer formed on the aluminum layer and having a thickness that is about 10% to 40% of the aluminum layer thickness.

According to an embodiment of the present invention, the aluminum layer and the top molybdenum layer are in direct contact with each other.

According to an embodiment of the present invention, the top molybdenum layer has a 20% through 27% thickness of the aluminum layer.

According to an embodiment of the present invention, the top molybdenum layer comprises at least one selected from a group consisting of tungsten (W), zirconium (Zr), tantalum (Ta), niobium (Nb), and nitrogen (N).

According to an embodiment of the present invention, the TFT array panel further comprises a bottom molybdenum layer formed on a bottom of the aluminum layer.

The foregoing and/or other aspects of the present disclosure can achieved by providing a device such as a TFT array panel comprising a gate wiring and a data wiring, wherein at least one of the gate and data wirings comprising an aluminum layer and a top molybdenum layer having a thickness about 10% to 40% of the thickness of the aluminum layer. The aluminum layer and the molybdenum layer may be formed in sequence.

The foregoing and/or other aspects of the present disclosure can achieved by providing a method of fabricating a display part such as a TFT array panel. The method may comprise depositing an aluminum layer on an insulating substrate, depositing a top molybdenum layer on the aluminum layer having a 10% through 40% thickness of the aluminum layer, and forming a wiring by patterning the aluminum layer and the top molybdenum layer.

According to the embodiment of the present invention, the method further comprises forming an insulating layer, a semiconductor layer and an ohmic contact layer in sequence on the wiring by a plasma enhanced chemical vapor deposition (PECVD) method.

In general, in another aspect, a display part may comprise a substrate and a wiring on the substrate. The wiring may comprise an aluminum layer and a molybdenum layer adjacent the aluminum layer. The aluminum layer and the molybdenum layer may each extend along a first direction, and each comprise a top surface, a bottom surface, a first lateral side surface having a first angle with respect to the bottom surface of the aluminum layer, and a second lateral side surface having a second angle with respect to the bottom surface of the aluminum layer. A width of the bottom surface of the molybdenum layer perpendicular to the first direction may be substantially the same as a width of the top surface of the aluminum layer perpendicular to the first direction. Further, first angle of the aluminum layer is substantially the same as the first angle of the molybdenum layer, and may be different than ninety degrees.

In general, in one aspect, the display part may comprise a liquid crystal display part. In another aspect, the display part may comprise an organic light emitting diode display part.

The aluminum layer may have a first thickness, and the molybdenum layer may have a thickness between about 10% and about 40% of the first thickness. The relative thickness of the molybdenum layer to the aluminum layer may be selected to substantially eliminate aluminum hillock formation.

The foregoing and/or other aspects of the present disclosure can achieved by providing a display part such as a liquid crystal display comprising a first substrate comprising a gate wiring and a data wiring, at least one of which comprises an aluminum layer and a top molybdenum layer having a 10% through 40% thickness of the aluminum layer, which are formed in sequence, a second substrate facing the first substrate; and a liquid crystal layer placed between the first substrate and the second substrate.

In wet etching, two points are important for forming the shape of a multi-layered wiring. One is the etching rate of a single metal layer, and the other is the standard reduction potential of each metal layer.

The single metal layer etch rate of a molybdenum layer is twice that of an aluminum layer, for an etchant such as phosphoric acid, nitric acid, acetic acid, which are exemplary etchants for wet etching.

However, in a case of a double layer structure comprising a lower aluminum layer and an upper molybdenum layer, the etching rate of the molybdenum layer becomes slower on the interface of the double layer structure because the metal layers have different standard reduction potentials. When adhered two metal layers are wet etched, the metal layer (anode) having relatively low standard reduction potential gives electrons to the metal layer (cathode) having relatively high standard reduction potential. Therefore, the etch rate of the cathode metal layer of the double layer structure is decreased in comparison to the single metal layer etch rate, due to an effect referred to as the galvanic effect.

Aluminum has a standard reduction potential of −1.76V, and molybdenum has a standard reduction potential of −0.2V. In the case of a molybdenum (Mo)/aluminum (Al) double layer structure, the aluminum layer, having relatively low standard reduction potential, gives electrons to the molybdenum layer. Therefore, the molybdenum layer receives the electrons and has a decreased etching rate as compared with the single metal layer.

Meanwhile, the cause of hillock formation on a wiring is as follows.

On the way of fabricating the TFT array panel, an insulating layer, a semiconductor layer, etc. are deposited using plasma enhanced chemical vapor deposition (PECVD) after forming an aluminum wiring. The PECVD is performed at a high temperature of about 300° C., and thus compressive stress is applied to aluminum. At this time, the aluminum moves along its surface, particularly, along a grain boundary and grows to lateral side or upper side of the aluminum wiring through the insulating layer, which is called the hillock.

In the case of the molybdenum (Mo)/aluminum (Al) double layer structure, it is difficult to form the wiring having a taper shape because of the galvanic effect and the hillock. According to an embodiment of the present invention, the thickness ratio of the molybdenum layer to the aluminum layer is adjusted, thereby forming the molybdenum (Mo)/aluminum (Al) double layer structure having a preferred shape.

BRIEF DESCRIPTION OF THE DRAWINGS

The above and/or other aspects and advantages of the present invention will become apparent and more readily appreciated from the following description of the embodiments, taken in conjunction with the accompany drawings of which.

DETAILED DESCRIPTION

Figure 1A:
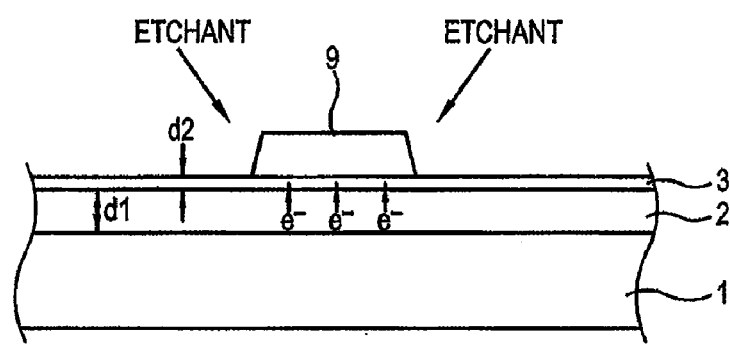
FIGS. 1A through 1C are cross sectional views showing a wiring with a top molybdenum layer having a first thickness.

Reference will now be made in detail to the embodiments of the present invention, examples of which are illustrated in the accompanying drawings, wherein like reference numerals refer to like elements throughout.

Figure 1B:
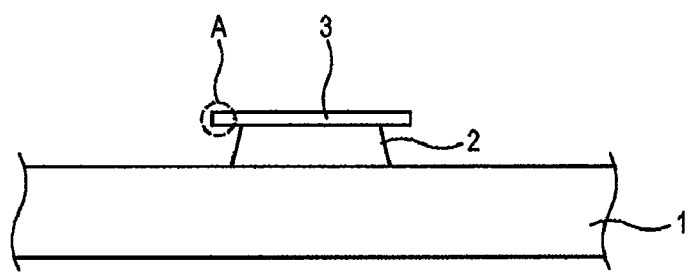
Figure 1C:
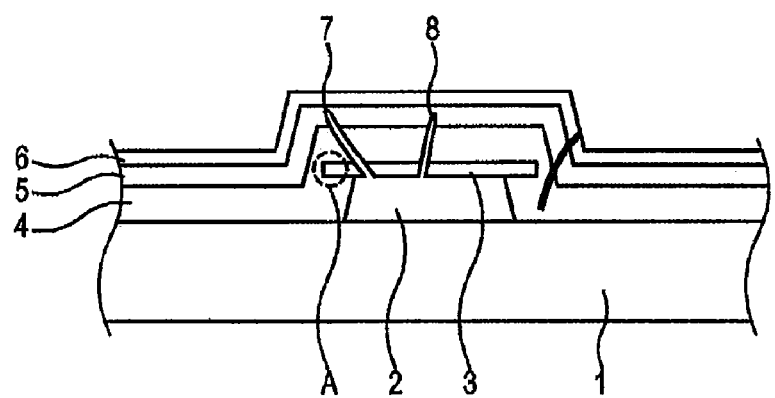

FIGS. 1A through 1C are cross sectional views showing a wiring structure with a top molybdenum layer having a first thickness, according to an embodiment of the present invention.

As shown in FIG. 1A, an aluminum layer 2 and a top molybdenum layer 3 are deposited on an insulating substrate 1 in sequence. A photoresist layer 9 is formed and patterned on the top molybdenum layer 3. Wet etching is performed to form a wiring corresponding to the shape of the photoresist layer 9. For example, an etchant etches the portions of both aluminum layer 2 and top molybdenum layer 3 that are not covered with the photoresist layer 9. Here, the thickness d1 of the aluminum layer 2 is relatively larger than the thickness d2 of the top molybdenum layer 3. The aluminum layer 2 has a relatively low standard reduction potential function, and functions as an anode supplying electrons to the top molybdenum layer 3, which has a relatively high standard reduction potential.

The top molybdenum layer 3 receives the electrons from the aluminum layer 2 and its etch rate is thus decreased by the galvanic effect. Since the thickness d1 of the aluminum layer 2 is relatively larger than the thickness d2 of the top molybdenum layer 3, the top molybdenum layer 3 receives a relatively large number of electrons per unit mass, resulting in a substantial decrease in the etching rate. As a result, the aluminum layer 2 is etched to a relatively greater degree, and a structure shaped as shown in FIG. 1B may be formed. The top molybdenum 3 is formed with an overhang A extending over the aluminum layer 2.

Referring to FIG. 1C, an insulating layer 4 made of silicon nitride or other suitable insulator, a semiconductor layer 5 made of amorphous silicon or the like, an ohmic contact layer 6 made of n+ hydrogenated amorphous silicon highly doped with n-type impurities are layered in sequence as a triple layer on the wiring structure shown in FIG. 1B. Here, the triple layer is typically deposited by plasma enhanced chemical vapor deposition (PECVD).

At this time, a high temperature of 300° C. or more may be applied to the wiring. As a result of the heating process, compressive stress is applied to the aluminum layer 2, so that a hillock structure comprising a side hillock 7 and a top hillock 8 is created (where the side and top hillocks are referred to collectively as hillock 7, 8). If its thickness is sufficient, the top molybdenum layer 3 may be used for capping the hillock 7, 8 created in the aluminum layer 2. Referring to FIG. 1C, the thickness d1 of the top molybdenum layer 3 is too small to cap the hillock 7, 8, so that the hillock 7, 8 penetrates the top molybdenum layer 3. Hillock 7, 8 may cause the wiring to be short-circuited, thereby lowering the reliability of the wiring.

Further, referring to FIG. 1C, the top molybdenum layer 3 has the overhang A, so that the triple layer adjacent to the overhang A is formed having a large layering angle. As a result, the triple layer may be broken, which is referred to as a step open. The step open may cause a short-circuit between the wirings.

Figure 2A:
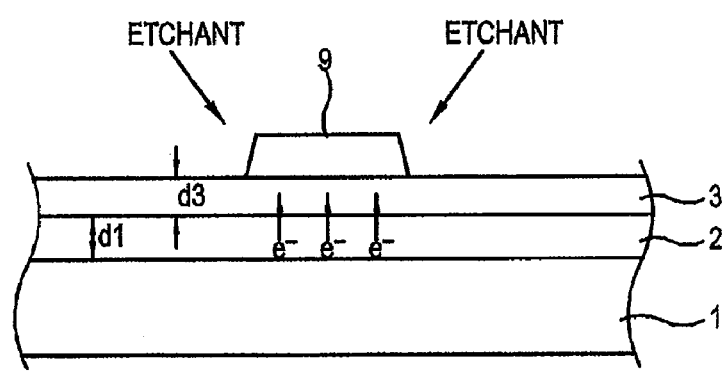
FIGS. 2A through 2C are cross sectional views showing a wiring with a top molybdenum layer having a second thickness.
Figure 2B:
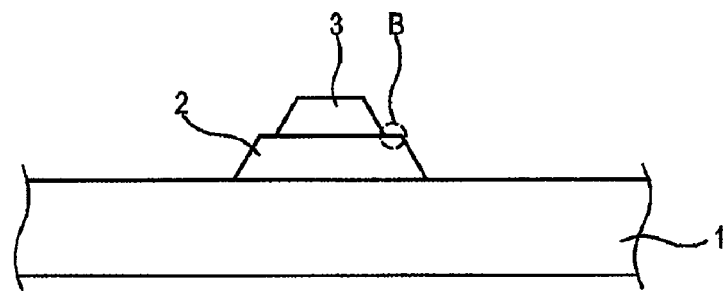
Figure 2C:
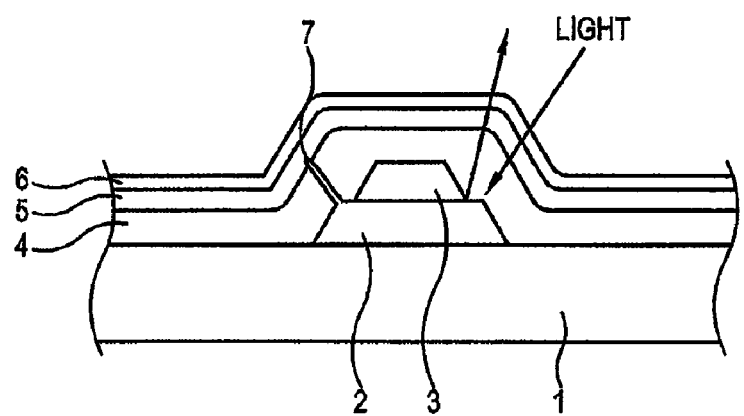

FIGS. 2A through 2C are cross sectional views showing a wiring with a top molybdenum layer having a second thickness. Here, the second thickness d3 of the top molybdenum layer 3 is relatively larger than the first thickness d2 of the top molybdenum layer 3 shown in FIG. 1A.

As shown in FIG. 2A, electrons from aluminum layer 2 are transferred to the top molybdenum layer 3. The thickness d3 of the top molybdenum layer 3 is relatively large, so that the number of electrons transferred to the top molybdenum layer 3 per unit mass is less than that in the configuration of FIG. 1A. Therefore, the etch rate of the top molybdenum layer 3 is less affected by the galvanic effect, and is similar to the etch rate of a single metal layer. As a result, the top molybdenum layer 3 is etched more than the aluminum layer 2, so that the wiring structure shown in FIG. 2B is formed. Referring to FIG. 2B, the aluminum layer 2 has a portion B that is not capped with the top molybdenum layer 3.

Referring to FIG. 2C, a triple layer is deposited in sequence on the wiring shown in FIG. 2B. Since the layering angle of the triple layer is decreased, the possibility of the step open arising also decreases. However, a protrusion such as side hillock 7 may grow in portion B of the aluminum layer 2, which is not capped with the top molybdenum layer 3. Further, portion B of the aluminum layer 2 reflects external light, thereby causing a spotted image to be displayed on a screen.

Figure 3A:
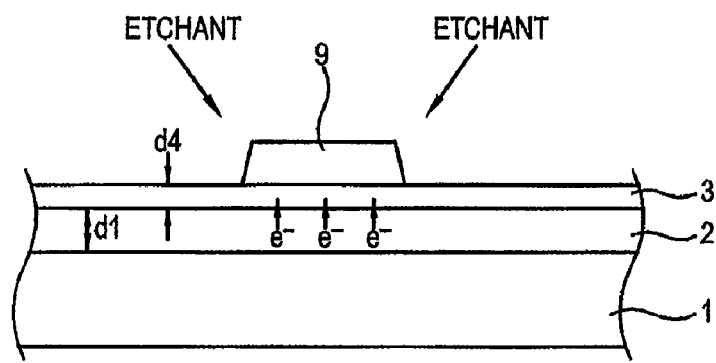
FIGS. 3A through 3C are cross sectional views showing a wiring with a top molybdenum layer having a third thickness.
Figure 3B:
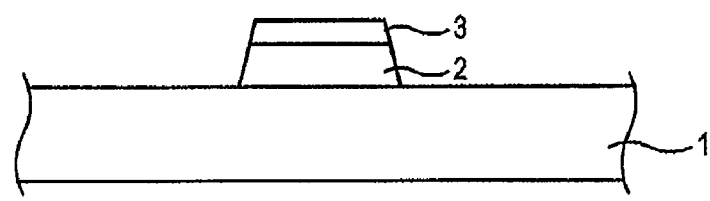
Figure 3C:
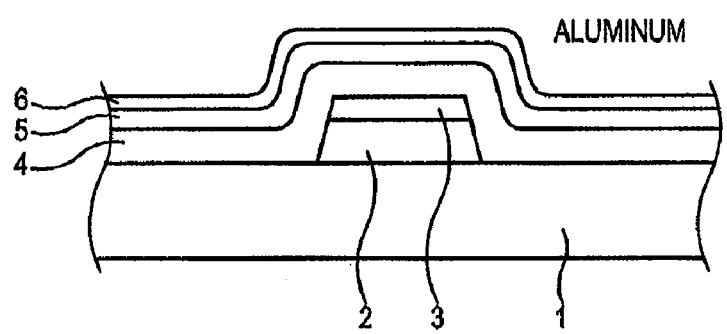

FIGS. 3A through 3C are cross sectional views showing a Wiring with a top molybdenum layer having a third thickness. Here, the third thickness d4 of the top molybdenum layer 3 is between the first thickness d2 and the second thickness d3.

As shown in FIG. 3A, electrons of the aluminum layer 2 are transferred to the top molybdenum layer 3. The thickness d4 of the top molybdenum layer 3 is properly adjusted so as to offset the galvanic effect by difference of the etching rate between the respective metal layers, thereby allowing the aluminum layer 2 and the top molybdenum layer 3 to have similar etch rates. When the etch rate of the aluminum layer 2 is similar to that of the top molybdenum layer 3, the wiring is formed with the structure shown in FIG. 3B. Here, the aluminum layer 2 and the top molybdenum layer 3 have a taper shape.

Referring to FIG. 3C, a triple layer is deposited in sequence on the wiring shown in FIG. 3B. At this time, the layering angle of the triple layer is relatively small, so the possibility of the step open arising is decreased. Further, the aluminum layer 2 is capped with the top molybdenum layer 3, thereby preventing the hillock from growing.

As described above, the thickness ratio of the aluminum layer 2 to the top molybdenum layer 3 is selected so that a taper is formed and protrusions of aluminum (hillocks) are substantially prevented. One way to determine the thickness ratio is to adjust the ratio so that the size of protrusions decreases. As the hillock is prevented, the wiring has a taper shape.

Figure 4:
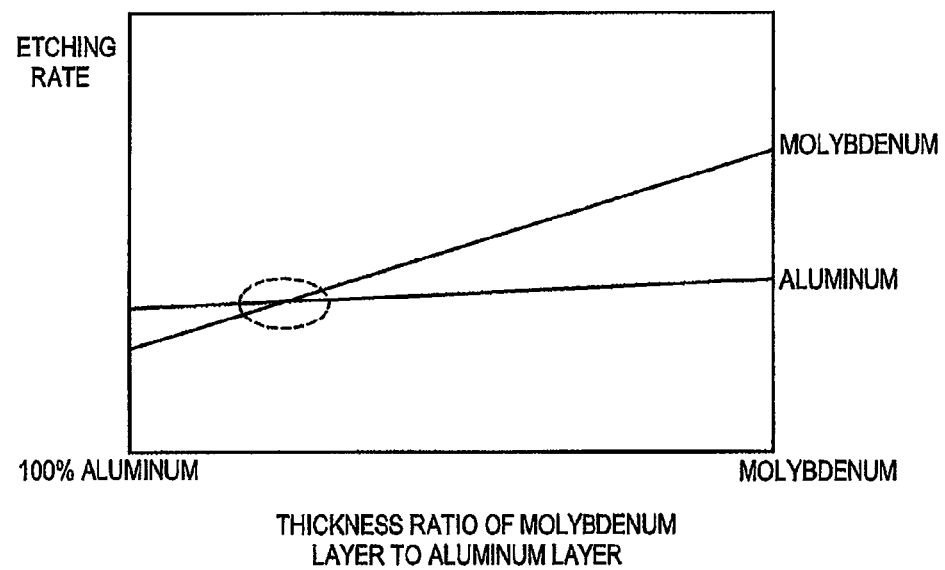
FIG. 4 shows change in an etching rate of molybdenum and aluminum according to a thickness ratio of the top molybdenum layer to an aluminum layer.

As shown in FIG. 4, the etch rates of molybdenum and aluminum are substantially equalized using a predetermined thickness ratio of the molybdenum layer to the aluminum layer. As the thickness ratio of the molybdenum layer to the aluminum layer increasingly differs from the predetermined thickness ratio, the difference between the etch rate of molybdenum and aluminum increases.

For example, as the thickness of the molybdenum layer decreases, the etch rate of aluminum exceeds that of molybdenum, because molybdenum is substantially affected by the galvanic effect. On the other hand, as the thickness of the molybdenum layer 3 increases, the etch rate of molybdenum exceeds that of aluminum, since the contribution to the etch rate due to the galvanic effect is substantially reduced.

Referring to FIG. 4, it is possible to determine a sufficient thickness ratio of the molybdenum layer to the aluminum layer, in order to substantially equalize the etch rates of aluminum and molybdenum.

EXPERIMENTAL EXAMPLE

To find a thickness ratio of the molybdenum layer to the aluminum layer at which the etch rates of the aluminum and molybdenum layers are substantially equalized (and hillock protrusion is substantially prevented), the following experiments may be performed.

The aluminum layer and the molybdenum layer are deposited in sequence on an insulating substrate using a sputtering method. For this example, the aluminum layer has a constant thickness of 3,000 Å, while the molybdenum layer has a variable thickness ranging from 200 Å through 1,500 Å.

Thereafter, the aluminum layer and the molybdenum layer are patterned using a wet etching method, and then a silicon nitride layer, an amorphous silicon layer, and an hydrogenated amorphous silicon layer are deposited thereon in sequence as a triple layer using a PECVD process at a temperature of about 320° C. For this example, the silicon nitride layer has a thickness of about 4,500 Å, the amorphous silicon layer has a thickness of about 2,000 Å, and the n+ hydrogenated amorphous silicon layer has a thickness of about 500 Å.

After the triple layer is deposited, the wiring is inspected using an optical microscope, to determine whether a top and/or side hillock has been formed.

Experimental conditions and existence of the hillocks are shown in <Table 1>, and FIGS. 5A through 10B are optical microscope photographs of the experimental examples.

TABLE 1

| Experimental examples | Thickness of aluminum layer (Å) | Thickness of molybdenum layer (Å) | Thickness ratio of molybdenum layer to aluminum layer (%) | Top hillock | Side hillock |
|---|---|---|---|---|---|
| 1 | 3,000 | 200 | 6.7 | ◉ | ◉ |
| 2 | 3,000 | 300 | 10 | ○ | Δ |
| 3 | 3,000 | 600 | 20 | ○ | X |
| 4 | 3,000 | 800 | 27 | X | Δ |
| 5 | 3,000 | 1,200 | 40 | X | Δ |
| 6 | 3,000 | 1,500 | 50 | X | ◉ |

◉: many, ○: some, Δ: a little, X: none

Figure 5A:
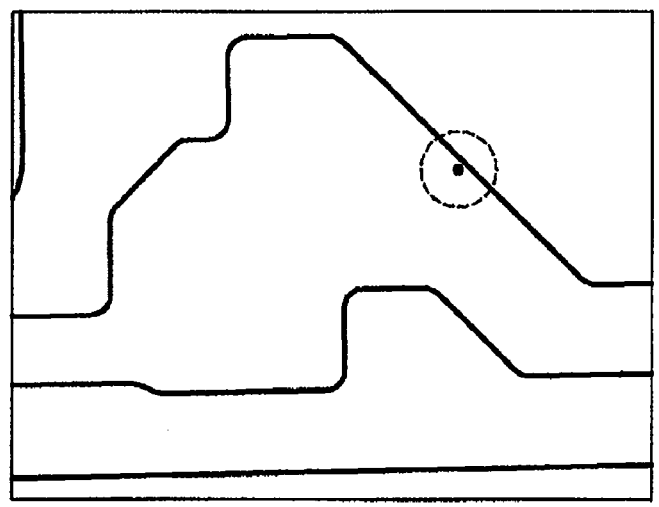
FIGS. 5A and 5B are optical microscope photographs of an experimental example 1 based on <Table 1>.
Figure 5B:
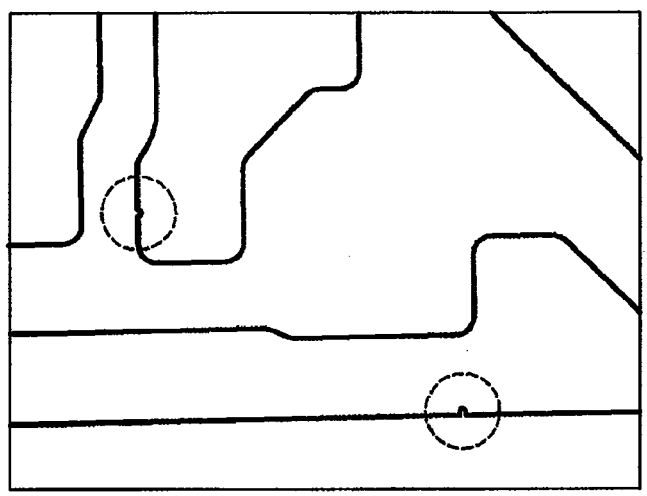
Figure 6A:
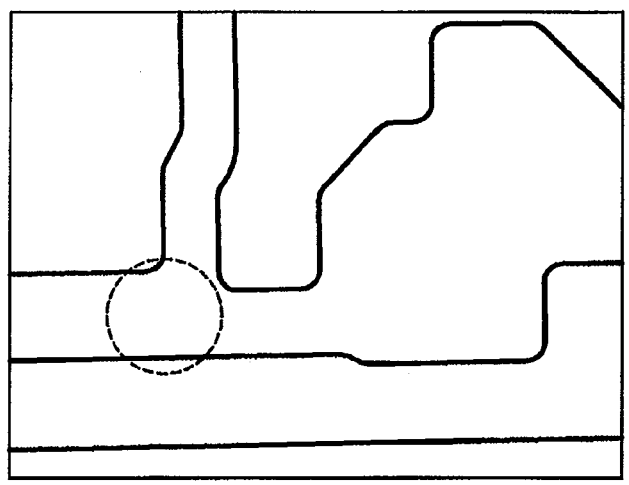
FIGS. 6A and 6B are optical microscope photographs of an experimental example 2 based on <Table 1>.
Figure 6B:
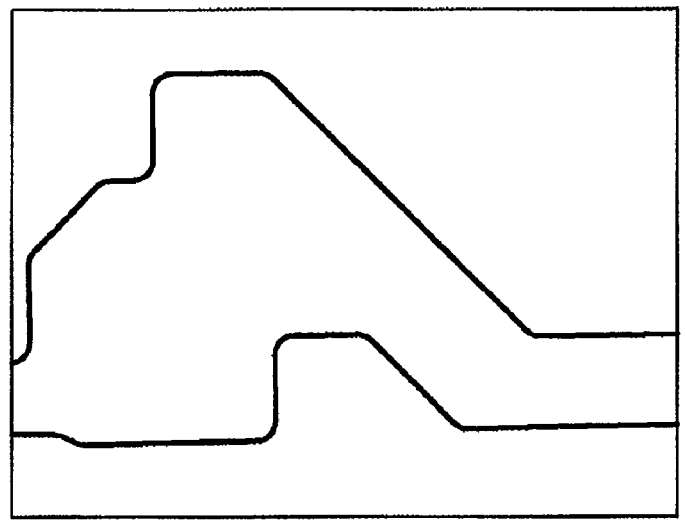
Figure 7A:
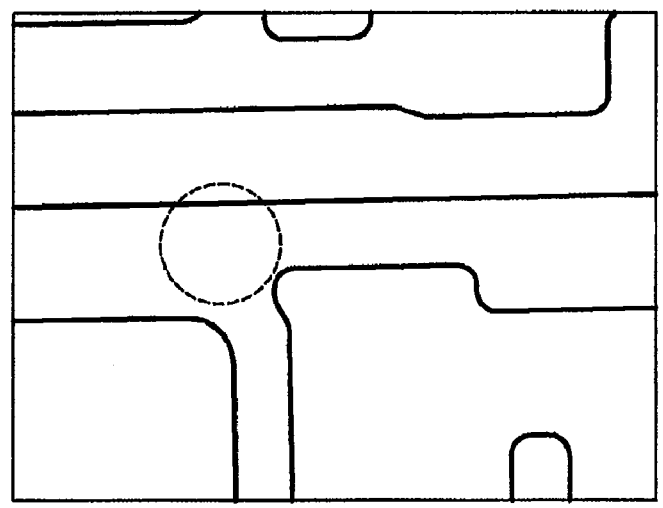
FIGS. 7A and 7B are optical microscope photographs of an experimental example 3 based on <Table 1>.
Figure 7B:
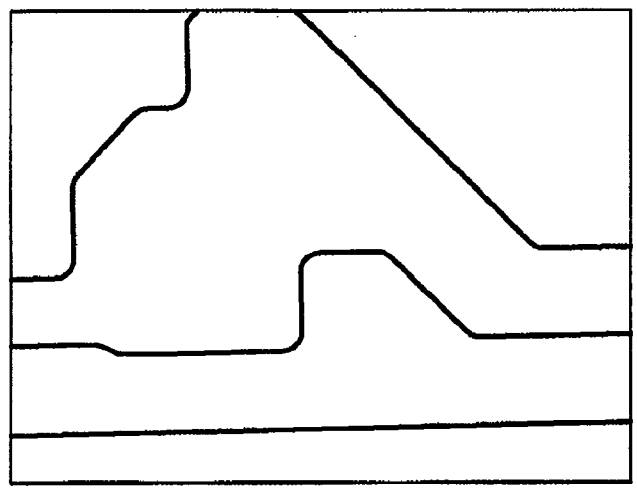
Figure 8:
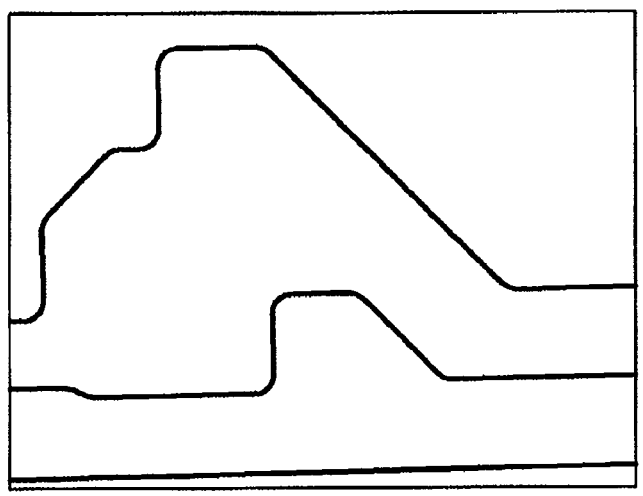
FIG. 8 is an optical microscope photograph of an experimental example 4 based on <Table 1>.
Figure 9:
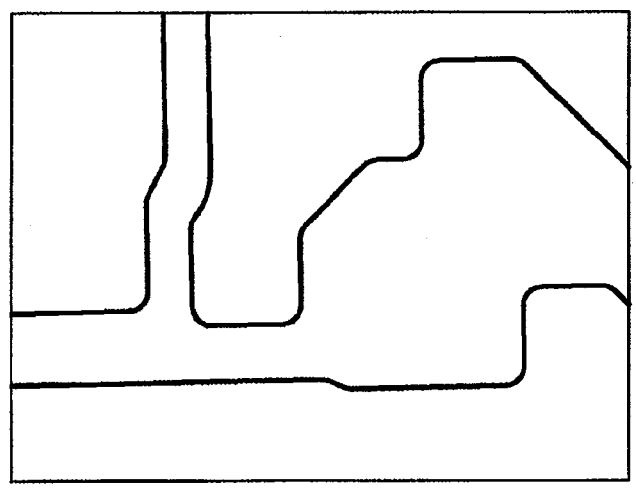
FIG. 9 is an optical microscope photograph of an experimental example 5 based on <Table 1>.
Figure 10A:
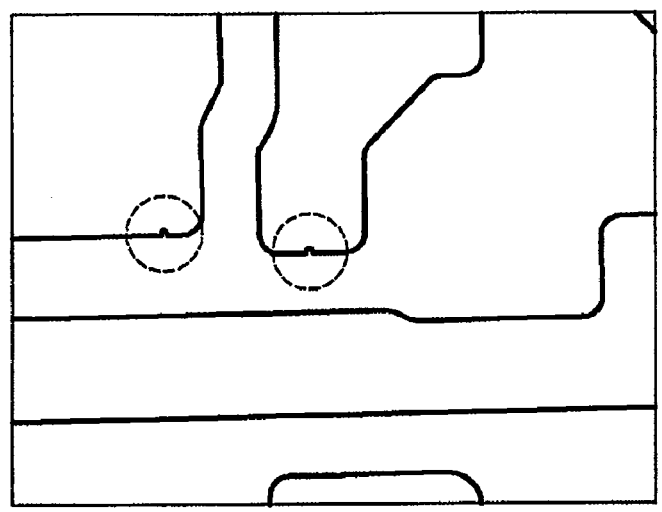
FIGS. 10A and 10B are optical microscope photographs of an experimental example 6 based on <Table 1>.
Figure 10B:
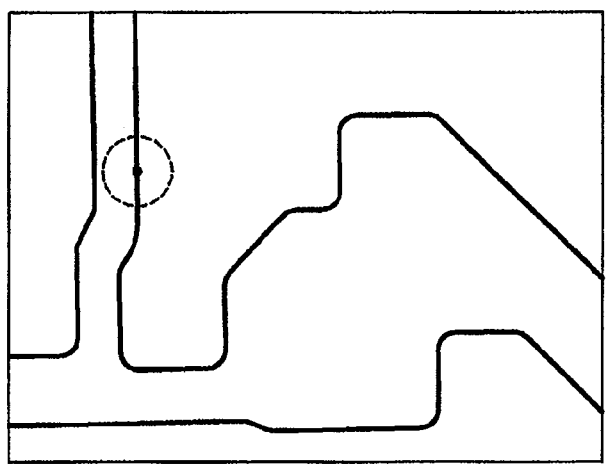

Referring to FIGS. 5A and 5B, many top and side hillocks are shown. In experimental example 1, the thickness ratio of the molybdenum layer to the aluminum layer are relatively small (about 6.67%), so that the hillocks are likely to penetrate the molybdenum layer.

In experimental example 2, the molybdenum layer and the aluminum layer have a thickness ratio of 10%, so that the hillocks (particularly the side hillocks) are remarkably decreased. In experimental example 3, the molybdenum layer and the aluminum layer have a thickness ratio of 20%, so that the hillocks are remarkably decreased. Specifically, in experimental example 3, the molybdenum layer has a sufficient thickness to prevent the side hillock from growing.

In experimental example 4, the molybdenum layer and the aluminum layer have a thickness ratio of 27%. In experimental example 4, there is no top hillock; however, a small side hillock is shown. Further, in experimental examples 5 and 6, the molybdenum layer and the aluminum layer have thickness ratios of 40% and 50%, respectively. In these examples, there is no top hillock but the side hillocks are increased. Particularly, the side hillocks are substantially increased in experimental example 6.

As the thickness ratio increases, the top hillock is prevented from protruding through the molybdenum layer (since the molybdenum layer is relatively thicker). However, as the thickness ratio of the molybdenum layer to the aluminum layer increases, the etching rate of the molybdenum layer increases. Therefore, the aluminum layer has a portion that is not capped with the molybdenum layer, and thus the side hillock can grow in this portion.

Based on the foregoing experimental examples, the thickness ratio of the molybdenum layer to the aluminum layer preferably ranges from 10% to 40%, to reduce the protrusion of hillocks (note that herein, ranges include the endpoints). Particularly, the thickness ratio of the molybdenum layer to the aluminum layer preferably ranges from 20% to 27% so as to decrease both the top hillocks and the side hillocks.

Exemplary embodiments of a TFT array panel and a fabricating method thereof will be described.

Figure 11:
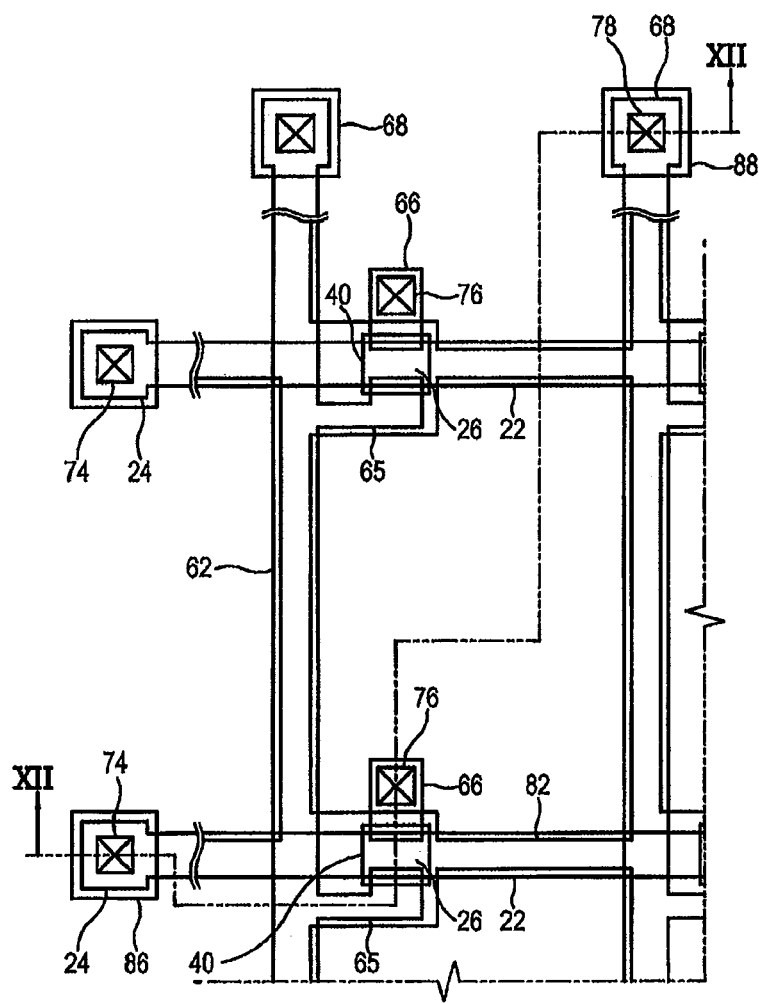
FIG. 11 is a plan view of a TFT array panel according to a first embodiment of the present invention.
Figure 12:
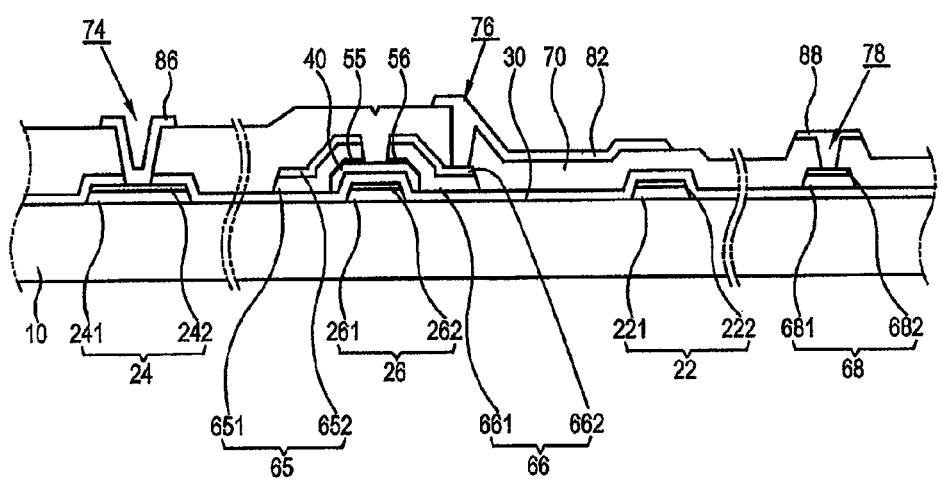
FIG. 12 is a cross sectional view of the TFT array panel, taken along line XII-XII of FIG. 11.

FIG. 11 is a plan view of a TFT array panel according to a first embodiment of the present invention; FIG. 12 is a cross sectional view of the TFT array panel, taken along line XII-XII of FIG. 11; and FIGS. 13 through 16 are cross sectional views illustrating a process of fabricating the TFT array panel according to the first embodiment of the present invention.

Gate wiring 22, 24 and 26 is formed on an insulating substrate 10. Here, each gate wiring 22, 24, 26 incorporates a multi-layer structure (e.g., dual layer), comprising an aluminum layer 221, 241, 261 and a top molybdenum layer 222, 242, 262. The thickness of top molybdenum layer 222, 242, 262 is between about 10% and about 40% of the thickness of the corresponding aluminum layer 221, 241, 261.

Gate wiring 22, 26 includes a gate line 22 formed in a horizontal direction, and a gate electrode 26 included in a thin film transistor and connected to the gate line 22, wherein the width of one end portion 24 of gate line 22 is enlarged to be connected with an external circuit.

Further, a gate insulating layer 30 may be formed on the insulating substrate 10. Gate insulating layer 30 may comprise, for example, silicon nitride (SiNx) or the like, and may cover the gate wiring 22, 24, 26.

A semiconductor layer 40 comprising amorphous silicon or the like may be formed on the gate insulating layer 30 of gate electrodes 26. Ohmic contact layers 55 and 56 comprising (for example) n+ hydrogenated amorphous silicon highly doped with n-type impurities may be formed on semiconductor layer 40.

Data wiring 65, 66, 68 may be formed on the ohmic contact layers 55, 56 and the gate insulating layer 30. Data wiring 65, 66, 68 may also have a double layer structure comprising an aluminum layer 651, 661, 681 and a top molybdenum layer 652, 662, 682. Here, the thickness of the top molybdenum layer 652, 662, 682 may be about 10% through 40% of the thickness of the aluminum layer 651, 661, 681.

The data line 62, illustrated in FIG. 11, is not shown in FIGS. 12-16 but may have the same double layer structure as the data wiring 65, 66, 68.

The data wiring 62, 65, 66, 68 comprises the data line 62 formed in a vertical direction and intersecting the gate line 22 to define a pixel, a source electrode 65 branched from the data line 62 and extended over the ohmic contact layer 55, and a drain electrode 66 separated from the source electrode 65 and formed over the ohmic contact layer 56. Drain electrode 66 may be positioned opposite the source electrode 65 across the gate electrode 26. Additionally, the width of one end 68 of the data line 62 may be enlarged to be connected to the external circuit.

Further, a passivation layer 70 may be formed on the data wiring 62, 65, 66, 68 and a portion of the semiconductor layer 40 not covered with the data wiring 62, 65, 66, 68. The passivation layer may comprise a SiNx layer, an a-Si:C:O layer, a-Si:O:F layer (low dielectric CVD layer), an acryl-based organic insulating layer, or other layer. An a-Si:C:O layer and/or a a-Si:O:F layer may be formed using a plasma-enhanced chemical vapor deposition (PECVD) method, and may have a low dielectric constant of 4 or below (e.g., may have a dielectric constant in the range from 2 to 4). Because of their relatively low dielectric constants, even relatively thin layers of a-Si:C:O or a-Si:O:F layer may have relatively low parasitic capacitances. Further, the a-Si:C:O and a-Si:O:F layers exhibit excellent step coverage and contact properties with respect to other layers. Also, a-Si:C:O and a-Si:O:F layers are inorganic CVD layers, and therefore have good heat-resistance compared to organic dielectric layers. Additionally, a deposition rate and an etching rate of a-Si:C:O layers and a-Si:O:F layers are four through ten times higher than those of SiNx, so that using an a-Si:C:O layer and/or an a-Si:O:F layer rather than SiNx may reduce process time.

The passivation layer 70 has a contact hole 76 through which the drain electrode 66 is exposed, a contact hole 78 through which an end portion 68 of the data line is exposed, and a contact hole 74 through which an end portion 24 of the gate line and the gate insulating layer 30 are exposed.

A pixel electrode 82 is formed on the passivation layer 70. Pixel electrode 82 may be electrically connected to the drain electrode 66 through the contact hole 76, and located on a pixel region. Contact subsidiary parts 86, 88 may be formed on passivation layer 70. Contact subsidiary parts 86, 88 may be connected to the end portion 24 of the gate line and the end portion 68 of the data line through the contact hole 74 and 78, respectively. Pixel electrode 82 and contact subsidiary parts 86, 88 may comprise a transparent conductive material such as ITO (indium tin oxide), IZO (indium zinc oxide), or other transparent conductive material. Drain electrode 82 may contact the pixel electrode 82 through the molybdenum layer 662.

Referring to FIGS. 11 and 12, the pixel electrode 82 is overlapped with the gate line 22, thereby forming a storage capacitor. If the capacitance of the storage capacitor is not sufficient, a storage capacitor line assembly may be provided at the same level as the gate wiring 22, 24, 26.

Further, the pixel electrode 82 may be overlapped with the data lines 62, to increase or maximize an aperture ratio. In such a configuration, the parasitic capacitance between the pixel electrode 82 and the data line 62 can generally be ignored, as long as the passivation layer 70 is a low dielectric constant layer (e.g., a low dielectric constant CVD layer as described above).

Figure 13:
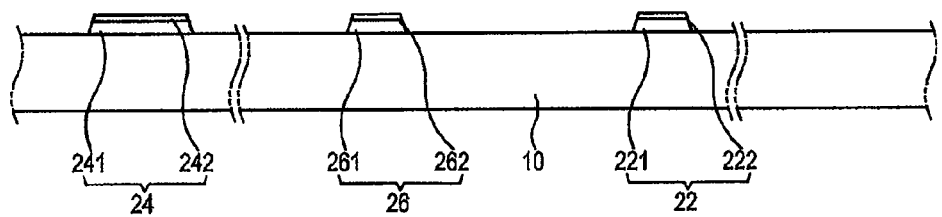
FIGS. 13 through 16 are cross sectional views illustrating a process of fabricating the TFT array panel according to the first embodiment of the present invention.

A method of fabricating the TFT array panel, according to some embodiments, is as follows. As shown in FIG. 13, a multi-layer gate conductor layer is formed on the insulating substrate 10. The gate conductor layer may have the double layer structure comprising the aluminum layer 221, 241, 261 and the top molybdenum layer 222, 242, 262. Thereafter, the gate metal layer is patterned by photolithography using a mask, to form the gate wiring 22, 24, 26. The gate wiring 22, 24, 26 includes the gate lines 22 and the gate electrodes 26, and extends in the horizontal direction (where directions are referred to as horizontal and vertical for illustrative purposes).

Figure 14:
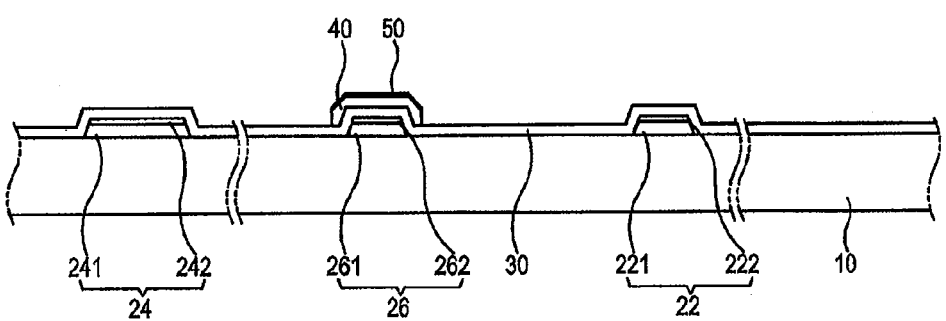

Referring to FIG. 14, gate insulating layer 30 (for example, silicon nitride), semiconductor layer 40 (for example, amorphous silicon), and a doped amorphous silicon layer 50 are sequentially deposited onto the insulating substrate 10. Semiconductor layer 40 and doped amorphous silicon layer 50 are patterned by photolithography using a mask. As a result, semiconductor layer 40 and ohmic contact layer 50 form an island-like structure on gate insulating layer 30 over gate electrode 26.

Figure 15:
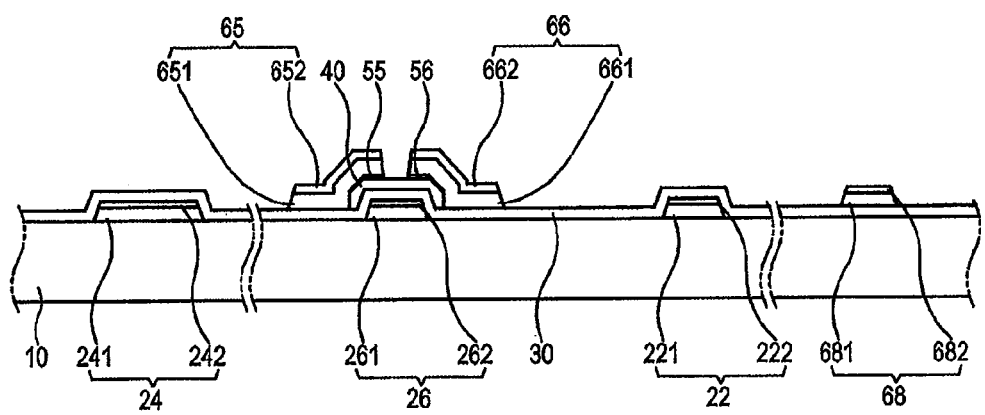

Referring to FIG. 15, a data metal layer having the double layer structure comprising the aluminum layer 651, 661, 681 and the top molybdenum layer 652, 662, 682 is deposited and patterned by photolithography using a mask, to form the data wiring including the data line 621. The data wiring comprises the data line 62 intersecting the gate line 22, the source electrode 65 connected to the data line 62 and extending over the gate electrode 26, and the drain electrode 66 isolated from the source electrode 65 and opposite to the source electrode 65 across the gate electrode 26.

Subsequently, the doped amorphous silicon layer 50 is etched to expose a portion of the semiconductor layer 40 between separate opposite doped amorphous silicon layers 55 and 56. Additionally, the structure may be placed in an oxygen plasma environment to stabilize the surface of the exposed semiconductor layer 40.

Figure 16:
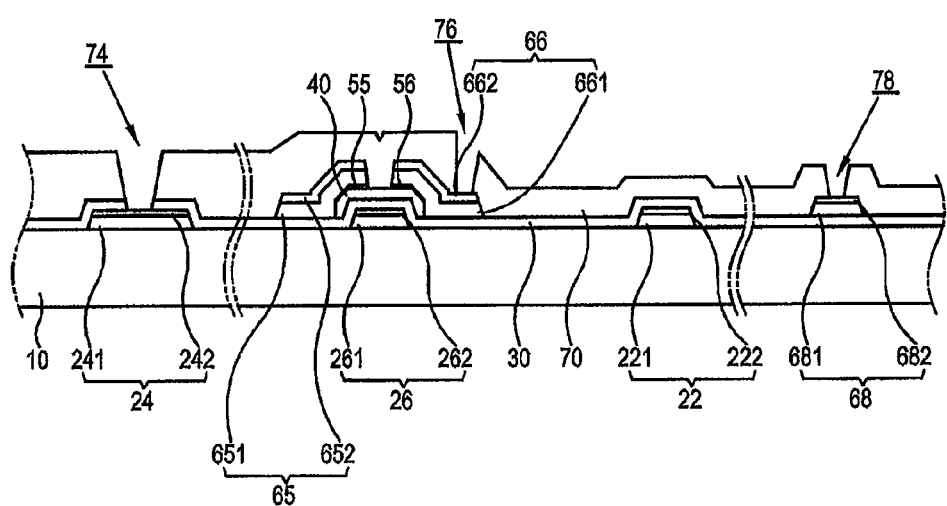

Then, referring to FIG. 16, passivation layer 70 may be formed. For example, passivation layer 70 may be formed by growing a silicon nitride layer, an a-Si:C:O layer, or an a-Si: C:F layer using a CVD method, or by coating the structure using an organic insulating material.

The passivation layer 70 and the gate insulating layer 30 may then be patterned by the photolithography to form the contact holes 74, 76, 78 exposing the end portion 24 of the gate line, a portion of the drain electrode 66, and the end portion 68, respectively.

Finally, referring to FIGS. 11 and 12, the ITO layer or the IZO layer is deposited and etched using photolithography techniques, thereby forming the pixel electrode 82 electrically connected to the drain electrode 66 through the contact hole 76 and forming the contact subsidiary parts 86, 88 respectively connected to the end portion 24 of the gate line and the end portion 68 of the data line through the contact holes 74, 78. Preferably, the structure is pre-heated in a nitrogen gas atmosphere before depositing the transparent conductor (e.g., ITO layer or IZO) layer.

The above-described first embodiment employs five masks in fabricating the TFT array panel, but the following second embodiment employs four masks.

Figure 17:
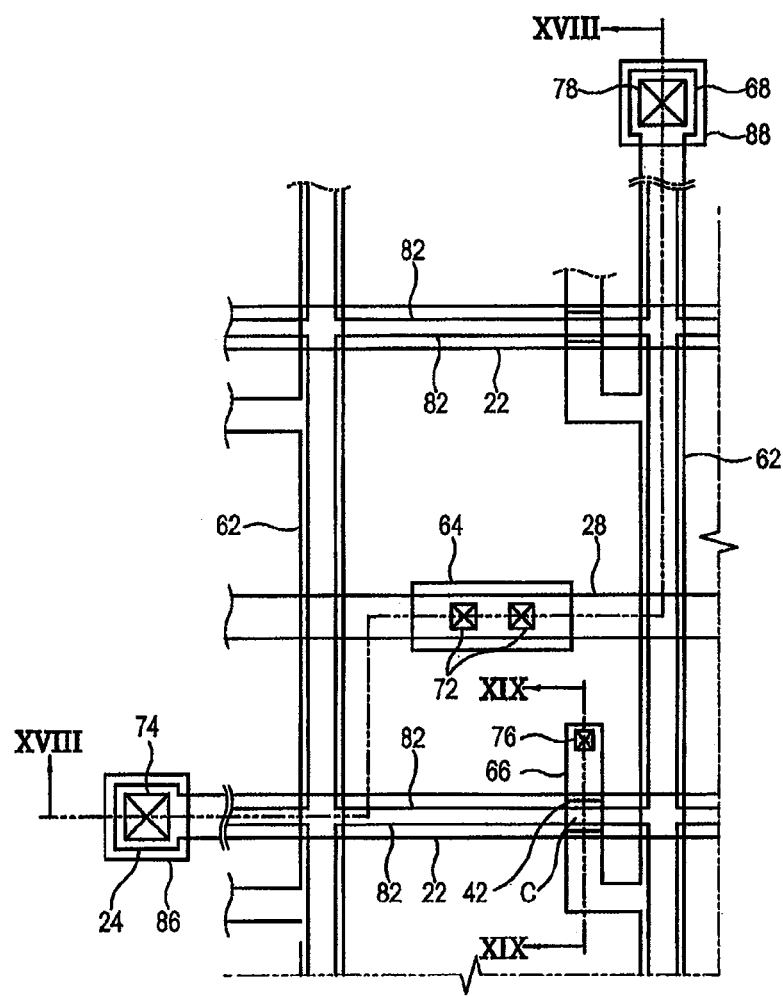
FIG. 17 is a plan view of a TFT array panel according to a second embodiment of the present invention.
Figure 18:
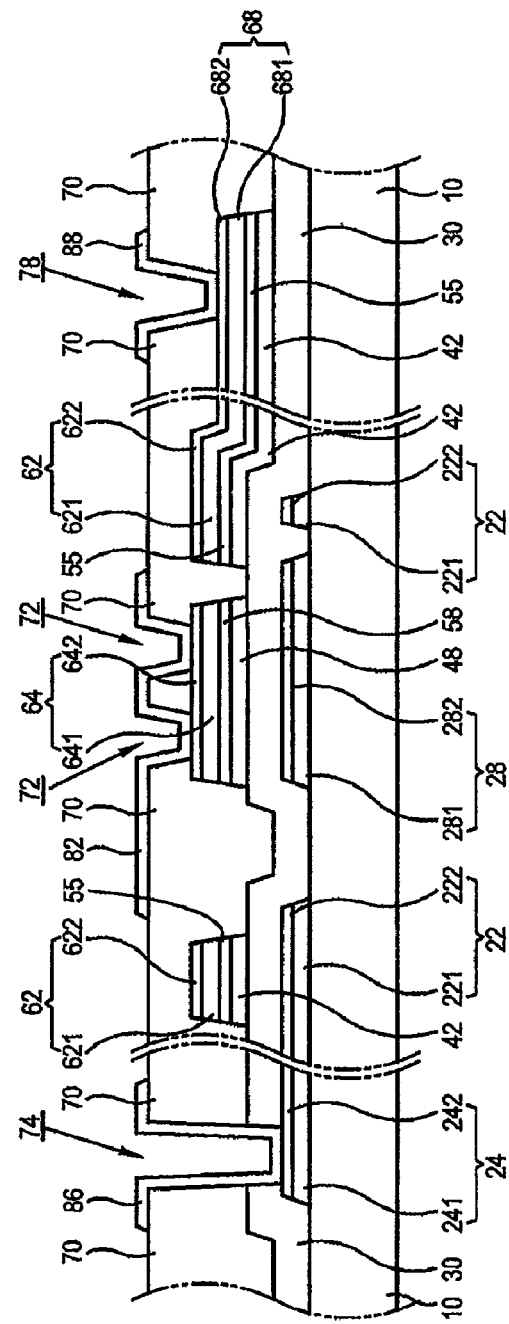
FIG. 18 is a cross sectional view of the TFT array panel, taken along line XVIII-XVIII of FIG. 17.
Figure 19:
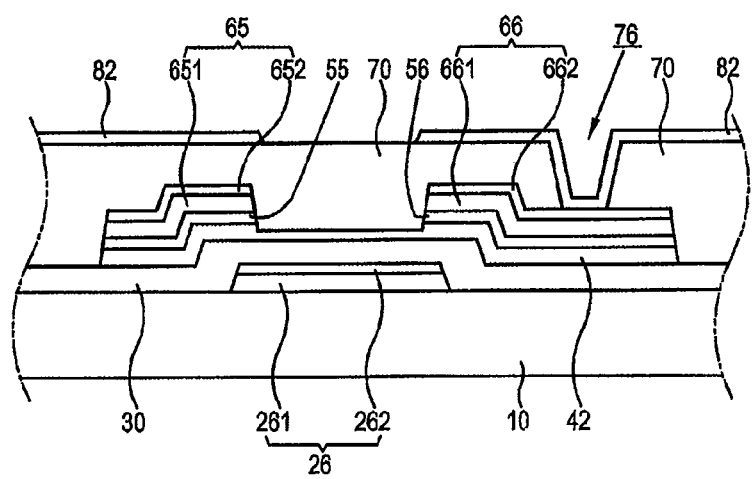
FIG. 19 is a cross sectional view of the TFT array panel, taken along line XIX-XIX of FIG. 17.

FIG. 17 is a plan view of a TFT array panel according to a second embodiment of the present invention; FIG. 18 is a cross sectional view of the TFT array panel, taken along line XVIII-XVIII of FIG. 17; FIG. 19 is a cross sectional view of the TFT array panel, taken along line XIX-XIX of FIG. 17; and FIGS. 20A through 27B are sectional views showing a process of fabricating the TFT array panel according to some embodiments of the present invention.

Like the first embodiment, gate wiring 22, 24, 26 having a double layer structure comprising a aluminum layer 221, 241, 261 and a top molybdenum layer 222, 242, 262 is formed on insulating substrate 10. The top molybdenum layer 222, 242, 262 may have a thickness that is 10% to 40% thickness of the aluminum layer 221, 241, 261.

Further, a storage electrode line 28 parallel to gate line 22 may be formed on the insulating substrate. Storage electrode line 28 has the same double layer structure as the gate wiring 22, 24, 26. The storage electrode line 28 is overlapped with a storage capacitor conductive pattern 64 connected to the pixel electrode 82 (to be described later), and forms a storage capacitor enhancing the electrical potential storage capacitance of a pixel. If the storage capacitance resulting from the overlap of the pixel electrode 82 with the gate line 22 is sufficient, the storage electrode line 28 can be omitted. In general, voltage applied to the storage electrode line 28 is equal to voltage applied to a common electrode of a top substrate.

Gate insulating layer 30, which may be a silicon nitride SiNx layer or the like, may be formed on the gate wiring 22, 24, 26 and the storage electrode line 28, thereby covering the gate wiring 22, 24, 26 and the storage electrode line 28.

Semiconductor patterns 42 and 48, which may comprise a semiconductor material such as hydrogenated amorphous silicon or the like, may be formed on the gate insulating layer 30. An ohmic contact pattern or an intermediate layer pattern 55, 56, 58 may be formed on the semiconductor patterns 42 and 48. Pattern 55, 56, 58 may be made of amorphous silicon or the like, and may be highly doped with n-type impurities such as phosphorous (P).

On the ohmic contact layer 55, 56 and 58 is formed a data wiring 62, 64, 65, 66, 68 having a double layer structure comprising the aluminum layer 621, 641, 651, 661, 681 and the top molybdenum layer 622, 642, 652, 662, 682 may be formed on ohmic contact layer 55, 56, 58. The top molybdenum layer 622, 642, 652, 662, 682 may have a thickness that is about 10% to 40% thickness of the aluminum layer 621, 641, 651, 661, 681. The data wiring comprises a data line portion 62, 68, 65 extending in a vertical direction. The data line portion 62, 68, 65 comprise a data line 62 having an end portion 68 to receive an external video signal, and a source electrode 65 of the thin film transistor branched from the data line 62. Further, the data wiring comprises a drain electrode 66 of the thin film transistor separated from the data line portion 62, 68, 65 and opposite to the source electrode 65 with respect to the gate electrode 26 or TFT channel portions C. Also, the data wiring comprises a storage capacitor conductive pattern 64 disposed on the storage electrode line 28. If the storage electrode line 28 is not provided, the storage capacitor conductive pattern 64 can be omitted.

The ohmic contact patterns 55, 56, 58 are used for lowering the contact resistance between the underlying semiconductor patterns 42, 48 and the overlying data wiring 62, 64, 65, 66, 68, and have the same shape as the data wiring 62, 64, 65, 66, 68. That is, the ohmic contact pattern 55 located under the data line part 62, 68, 65 has the same shape as the data line part 62, 68, 65; the ohmic contact pattern 56 located under the drain electrode 66 has the same shape as the drain electrode 66; and the ohmic contact pattern 58 located under the storage capacitor conductive pattern 64 has the same shape as the storage capacitor conductive pattern 64.

The semiconductor patterns 42, 48 have a similar shape as the data wiring 62, 64, 65, 66, 68 and the ohmic contact patterns 55, 56, 58, except for the TFT channel portions C. In more detail, the storage capacitor semiconductor pattern 48, the storage capacitor conductive pattern 64, and the storage capacitor ohmic contact pattern 58 have similar shapes. The TFT semiconductor pattern 42 differs in shape from the data wiring and the other portions of the ohmic contact patterns. That is, at the TFT channel portion C, particularly, the source electrode 65 and the drain electrode 66 of the data line part 62, 68, 65 are separated from each other, and the data line intermediate layer pattern 55 and the drain electrode ohmic contact pattern 56 are separated from each other. However, the TFT semiconductor pattern 42 continuously extends at the TFT channel portion C without separation, thereby forming the channel of the thin film transistor.

Passivation layer 70, which may comprise silicon nitride, a-Si:C:O layer or a-Si:O:F layer (low dielectric layer) deposited by the PECVD method, organic insulating layer, or other passivation layer, is formed on the data wiring 62, 64, 65, 66, 68. The passivation layer 70 has contact holes 76, 78, 72 through which the drain electrodes 66, the end portion 68 of the data line, and the storage capacitor conductive pattern 64 are exposed, respectively. Further, the passivation layer 70 has a contact hole 74. The contact hole 74 penetrates the gate insulating layer 30 and exposes the end portion 24 of the gate line 22.

The pixel electrode 82 to receive a video signal from the thin film transistors and generate an electric field together with an upper electrode (not shown) is formed on the passivation layer 70. The pixel electrode 82 is made of a transparent conductive material such as ITO, IZO or the like. The pixel electrode 82 is physically and electrically connected to the drain electrode 66 via the contact hole 76, thereby receiving the video signal. Here, the pixel electrode 82 is overlapped with the neighboring gate line 22 and the neighboring data line 62 to enhance the aperture ratio. Alternatively, the pixel electrode 82 may be not overlapped with the neighboring gate line 22 and the neighboring data line 62.

The pixel electrode 82 may further be electrically connected to the storage capacitor conductive pattern 64 through the contact hole 72 and may transmit the video signal to the storage capacitor conductive pattern 64. Meanwhile, contact subsidiary parts 86, 88 are formed over the end portion 24 of the gate line and the end portion 68 of the data line, and are connected to both the end portion 24 of the gate line and the end portion 68 of the data line through the contact holes 74, 78, respectively. The contact subsidiary parts 86, 88 enhance adhesion of the end portions 24, 68 to external circuits and protect the end portions 24, 68, respectively. The contact subsidiary parts 86, 88 are made of a transparent conductive material, such as ITO, IZO, and/or other appropriate material.

Figure 20A:
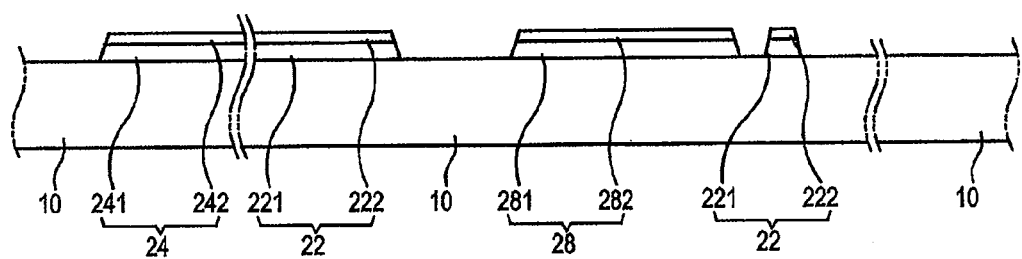
FIGS. 20a through 27b are cross sectional views illustrating a process of fabricating the TFT array panel according to the second embodiment of the present invention.
Figure 20B:
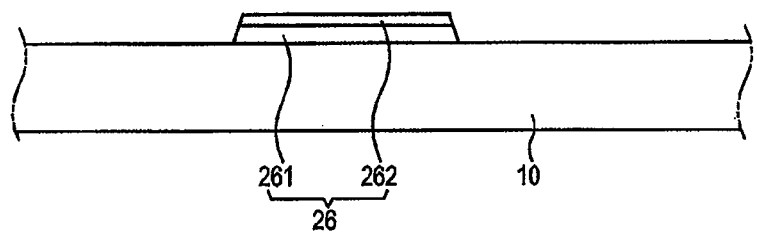

A method of fabricating the TFT array panel according to the second embodiment of the present invention is as follows. As shown in FIGS. 20A through 20B, the aluminum layer 221, 241, 261, 281 and the top molybdenum layer 222, 242, 262, 282 are deposited and patterned by the photolithography (as described above with respect to the first embodiment), thereby forming the gate wiring comprising the gate line 22 and the gate electrode 26, and the storage capacitor electrode 28. At this point in the process, the width of one end portion 24 of the gate line 22 is enlarged to be connected with an external circuit.

Figure 21A:
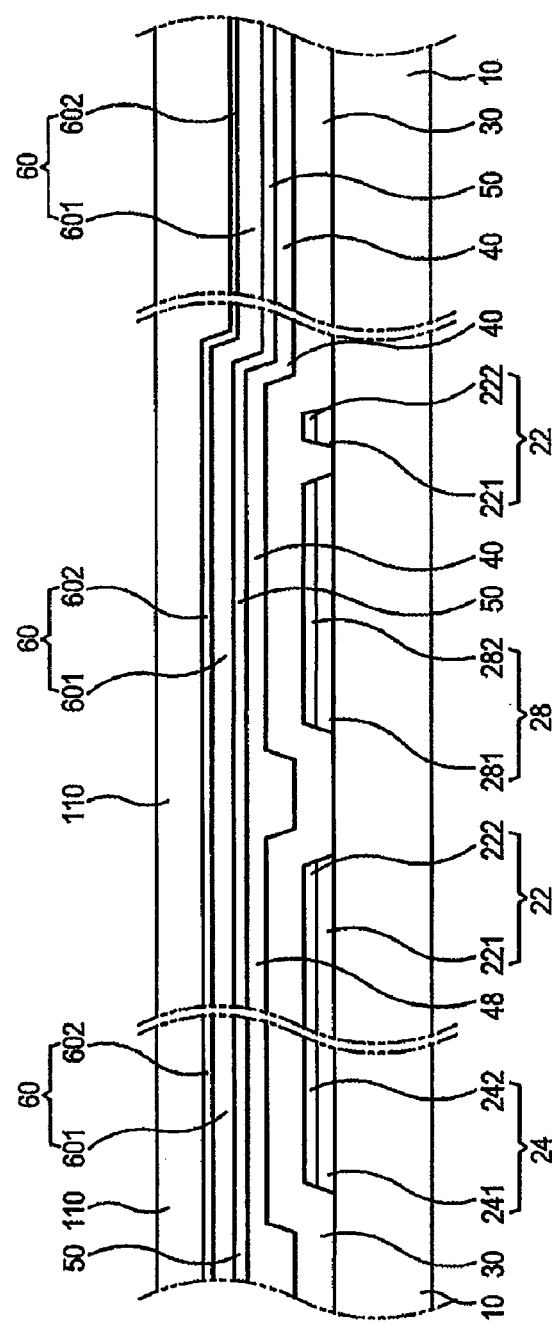
Figure 21B:
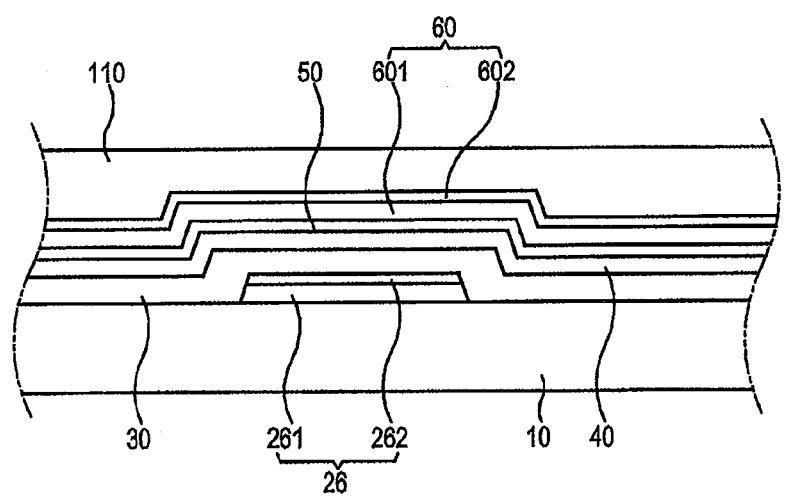

Thereafter, referring to FIGS. 21A and 21B, the gate insulating layer 30 having a thickness of about 1500 Å through about 5000 Å, the semiconductor layer 40 having a thickness of about 500 Å through about 2000 Å, and the intermediate layer 50 having a thickness of about 300 Å to about 600 Å are sequentially deposited by the CVD method. The conductive layer 60 having a double layer structure comprising an aluminum layer 601 and a molybdenum layer 602 is deposited to form the data wiring. Then, a photoresist film 110 having a thickness of about 1 μm to about 2 μm is coated onto the conductive layer 60.

Figure 22A:
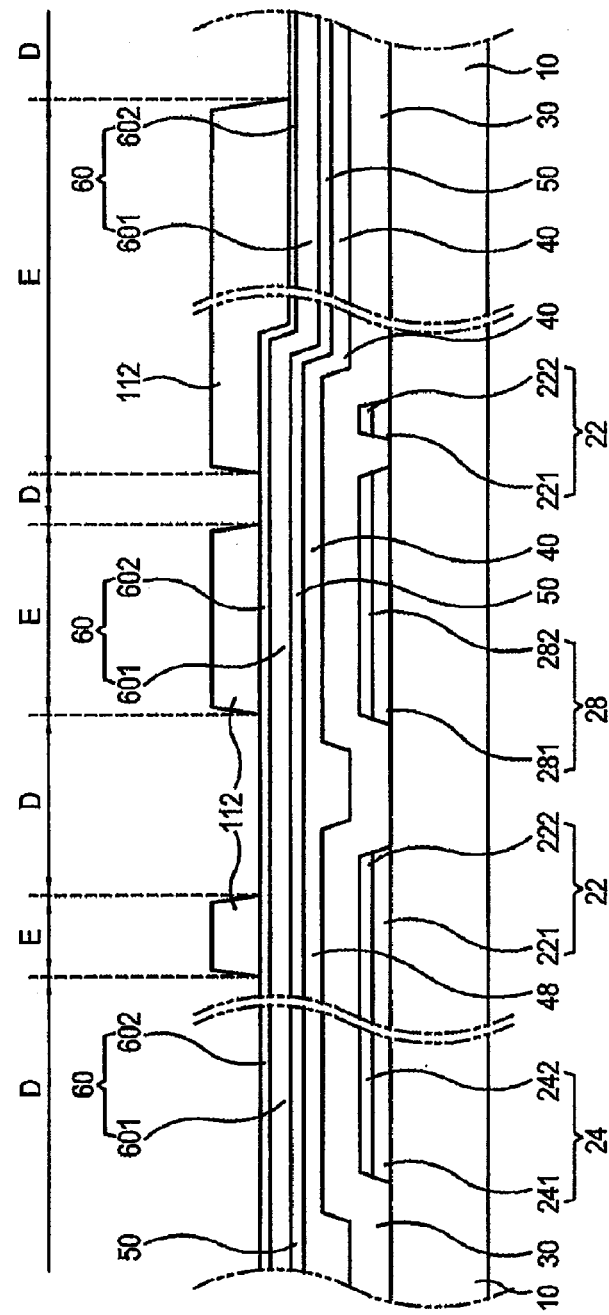
Figure 22B:
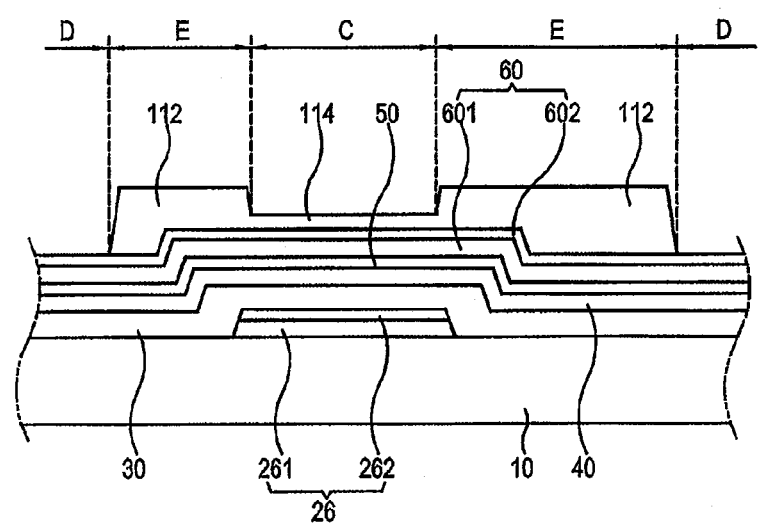

Referring to FIGS. 22A and 22B, the photoresist film 110 is exposed to light through a mask, and developed to thereby form a photoresist pattern 112, 114. A first photoresist pattern portion 114 positioned at the TFT channel portion C between the source and drain electrodes 65, 66 is established to have a thickness smaller than that of a second photoresist pattern portion 112 positioned at a data wiring portion E in which the data wiring 62, 64, 65, 66, 68 will be formed. On the other hand, the photoresist pattern portion 110 positioned at the other portion D is removed. At this time, the thickness ratio of the first photoresist pattern portion 114 positioned at the TFT channel portion C to the second photoresist pattern portion 112 remaining at the data wiring portion E should be controlled depending upon the processing conditions in the subsequent etching process. For example, for a first set of processing conditions, the thickness of the first photoresist pattern portion 114 may be formed to be about ½ or less of that of the second photoresist pattern portion 112. Preferably, the thickness of the first photoresist pattern portion 114 can be formed to be about 4000 Å or less.

According to an embodiment of the present invention, various methods can be used to differentiate the thickness of the photoresist film 110. The methods may employ a slit pattern, a lattice pattern or a semitransparent film to control the light transmissivity in the portion C.

For a process using a slit pattern or a lattice pattern, it is preferable that the width of the slit or lattice be smaller than the light decomposition capability of a light exposure apparatus. For a process using semitransparent film, the semitransparent film can have at least two thin films different in transmissivity or thickness to adjust the amount of light coupled to photoresist in an exposure process.

When the photoresist film is exposed to light through the mask, polymers of the photoresist film 110 directly exposed to light are substantially fully decomposed (i.e., one or more bonds of the polymer molecule are broken so that a subsequent development process will remove the material). Further, the polymers of the photoresist film corresponding to the slit pattern or the semitransparent film of the mask are decomposed to a lesser degree, so that not all of the photoresist will be removed in the subsequent development process. However, the polymers of the photoresist film blocked from the mask are not decomposed.

When the photoresist film 110 is developed after exposing to the light, the portions where the polymers are not decomposed remain. The portions where substantially all of the photoresist is decomposed are substantially removed. The portions where some of the photoresist is decomposed and some is not remain, with a thickness that is less than the thickness of the regions that were not exposed to light. The thickness of the remaining photoresist depends on the extent of the exposure to the light. The light exposing time should be not so long that all the molecules of the photoresist film are prevented from being decomposed.

Alternatively, the first photoresist pattern portion 114 having a relatively thin thickness can be formed using a photoresist film capable of reflow. The photoresist film is exposed to light through a usual mask with a light transmission portion and a light interception portion. Then, the light-exposed photoresist film is developed, and reflows such that the film portion is partially flown to the non-film area, thereby forming a thin photoresist pattern 114.

Thereafter, the first photoresist pattern portion 114 and its underlying layers, (e.g., the conductive layer 60, the intermediate layer 50, and the semiconductor layer 40) are etched. At this time, the data wiring and its underlying layers remain at the data wiring portion E, and only the semiconductor layer 40 remains at the TFT channel portion C. Further, the conductive layer 60, the intermediate layer 50, and the semiconductor layer 40 are all removed at the other portion D, thereby exposing the underlying gate insulating layer 30.

Figure 23A:
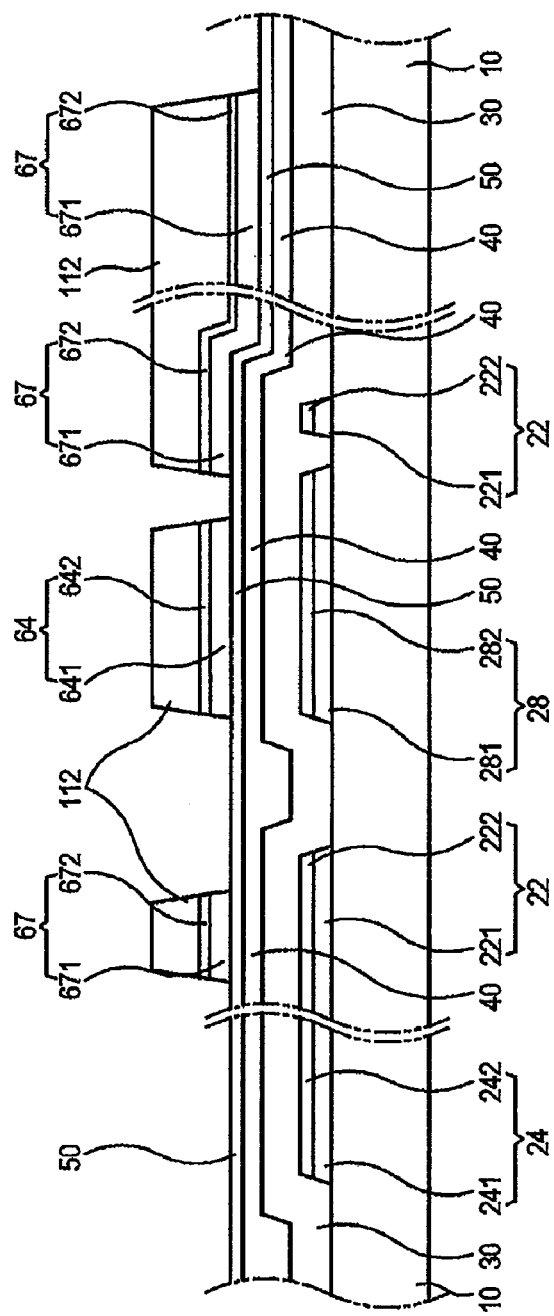
Figure 23B:
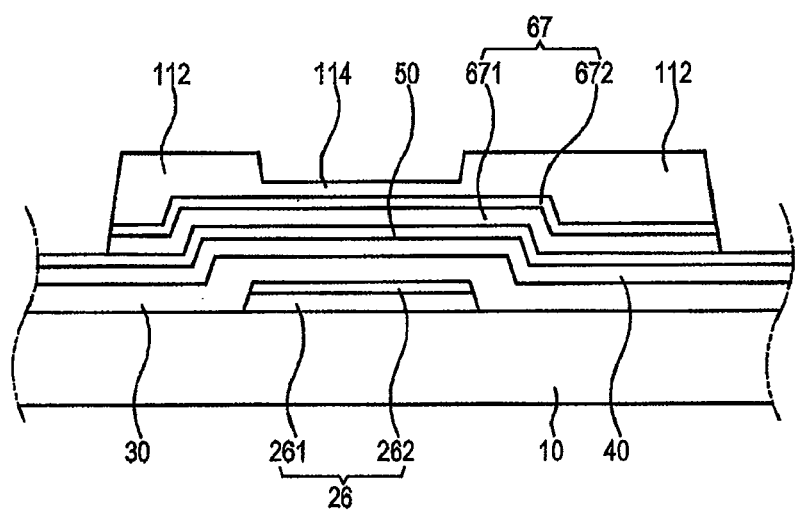

First, referring to FIGS. 23A and 23B, the conductive layer 60 exposed at the other portion D is removed, thereby exposing the underlying intermediate layer 50. According to an embodiment of the present invention, either a dry etching method or a wet etching method can be used for etching the conductive layer 60. Both etching methods are preferably performed so that the photoresist pattern portions 112, 114 are hardly etched while the conductive layer 60 is etched (i.e., the etch process is selective of conductive layer 60 with respect to photoresist pattern portions 112, 114). However, in the case of the dry etching method, it is difficult to find etch parameters that do not etch the photoresist pattern portions 112, 114. Therefore, the dry etching method may be performed under conditions in which both the conductive layer 60 and the photoresist pattern portions 112, 114 are etched. For the dry etching method, the first photoresist pattern portion 114 is formed to be thicker than the first photoresist pattern portion 114 for a wet etching method, in order to prevent the underlying conductive layer 60 from being exposed.

Consequently, as shown in FIGS. 23A and 23B, the conductive layer at the channel area C and the data wiring area E is patterned. That is, the source/drain conductive pattern 67 and the storage capacitor conductive pattern 64 remain, whereas the conductive layer 60 placed at the other portion D is substantially removed, thereby exposing the underlying intermediate layer 50. At this time, the remaining conductive patterns 67, 64 have a similar shape as the data wiring 62, 64, 65, 66, 68, except that source and drain electrodes 65 and 66 are not yet separated from each other and connected to each other. Furthermore, when the dry etching method is performed, the photoresist pattern portions 112 and 114 are also removed (to some degree).

Figure 24A:
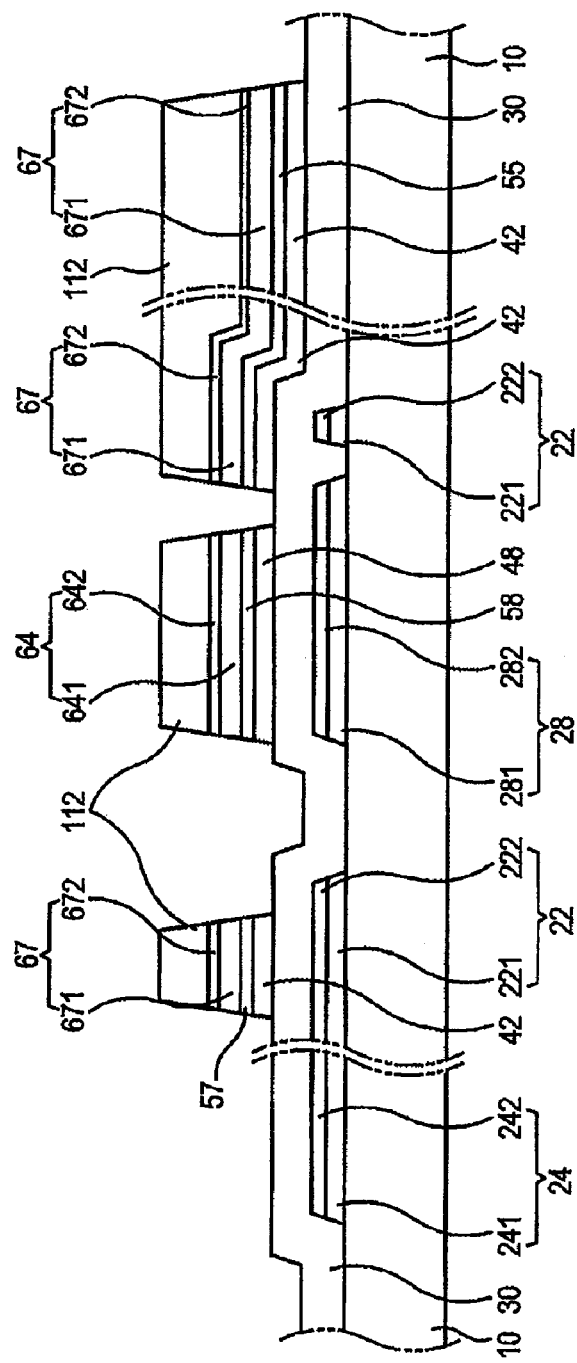
Figure 24B:
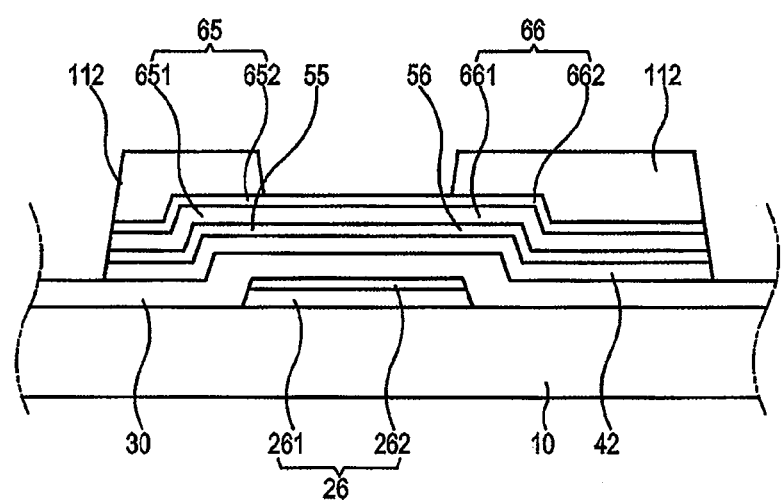

Referring to FIGS. 24A and 24B, the intermediate layer 50 exposed at the other portion D and the underlying semiconductor layer 40, together with the first photoresist pattern portion 114, are simultaneously removed by the dry etching method. At this time, the dry etching method is performed under the conditions that the photoresist pattern portions 112 and 114, the intermediate layer 50, and the semiconductor layer 40 (where, the semiconductor layer and the intermediate layer has no etch selectivity) are simultaneously etched, whereas the gate insulating layer 30 is not etched. Particularly, the dry etching method is preferably performed under the conditions that the etching rates with respect to the photoresist patterns 112 and 114 and the semiconductor layer 40 are approximately similar to each other.

For example, a gas mixture of $SF_6$ and HCl, or $SF_6$ and $O_2$ is used to etch the photoresist pattern 112 (or 114) and the semiconductor layer 40 by substantially the same amount. When the etching rates of the photoresist patterns 112 and 114 and the semiconductor layer 40 are the same or substantially the same, the thickness of the first photoresist pattern 114 is preferably the same as or less than the sum of the thicknesses of the semiconductor layer 40 and the intermediate layer 50.

Consequently, as shown in FIGS. 24A and 24B, the first photoresist pattern portion 114 at the channel portion C is removed, and the source/drain conductive pattern 67 is exposed. The intermediate layer 50 and the semiconductor layer 40 at the other portion D area are removed, and the underlying gate insulating layer 30 is exposed. Meanwhile, the second photoresist pattern portion 112 at the data wiring portion E is also etched, so that the thickness thereof is reduced. Further, in this process, the semiconductor patterns 42 and 48 are formed. Reference numerals 57 and 58 indicate the intermediate pattern under the source/drain conductive pattern 67 and the intermediate pattern under the storage capacitor conductive pattern 64, respectively.

Then, photoresist residue on the source/drain conductive pattern 67 at the channel portion C is removed using an ashing process.

Figure 25A:
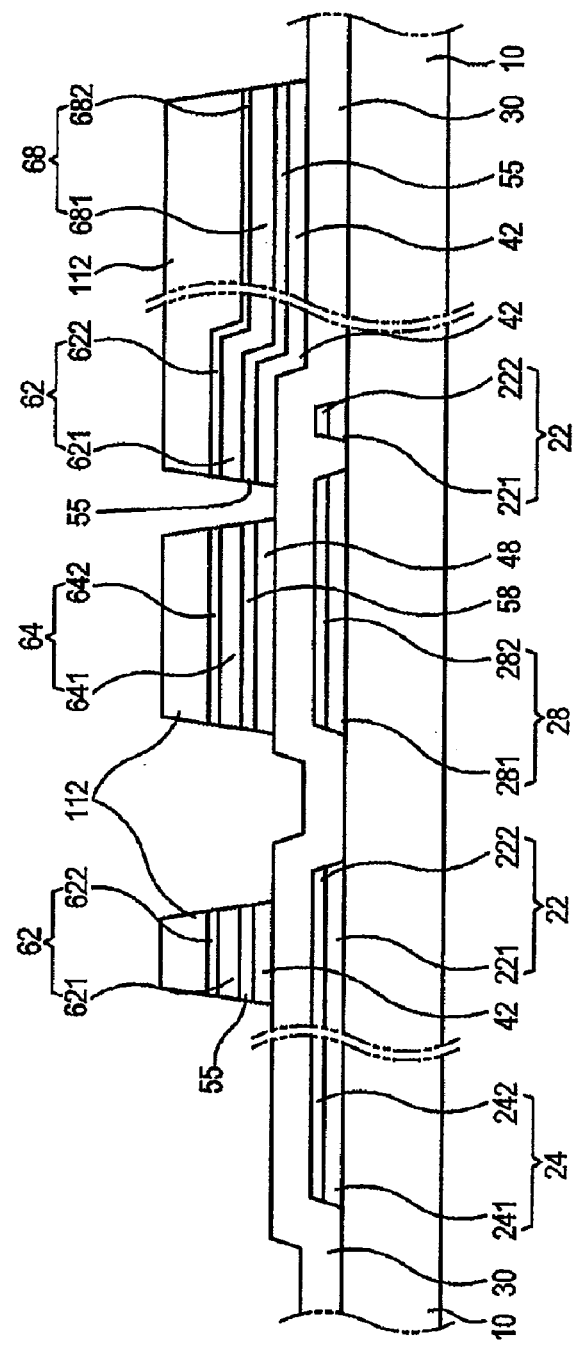
Figure 25B:
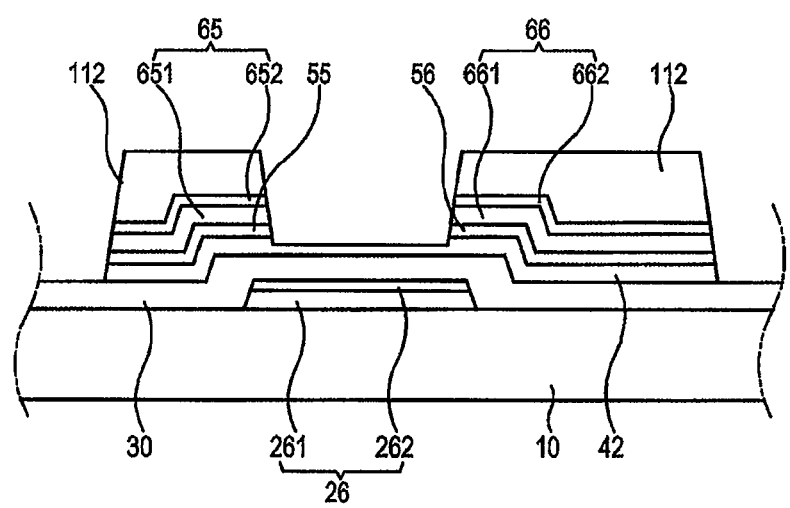

Thereafter, referring to FIGS. 25A and 25B, the source/drain conductive pattern 67 and the source/drain intermediate layer pattern 57 at the channel portion C area are etched and removed. According to an embodiment of the present invention, the dry etching method is applied to both the source/drain conductive pattern 67 and the source/drain intermediate layer pattern 57. Alternatively, the wet etching method can be applied to the source/drain conductive pattern 67, and the dry etching method can be applied to the source/drain intermediate layer pattern 57.

In the former case, it is preferable that the etch selectivity of the source/drain conductive pattern 67 to the source/drain intermediate layer pattern 57 is high. If the etching selectivity is not high, it is difficult to find the end point of the etching process and to control the thickness of the semiconductor pattern 42 remaining at the channel portion C. In the latter case (that is, when the wet etching method and the dry etching method are alternated), lateral sides of the source/drain conductive pattern 67 are etched by the wet etching method, but lateral sides of the source/drain intermediate layer pattern 57 are not substantially etched by dry etching, so that a cascade structure is formed. A gas mixture of $CF_4$ and HCl, or $CF_4$ and $O_2$ can be preferably used for etching the intermediate layer pattern 57 and the semiconductor pattern 42. When the mixture gas of $CF_4$ and $O_2$ is used, the semiconductor pattern 42 may have a substantially uniform thickness.

At this time, as shown in FIG. 25B, the semiconductor pattern 42 can be partially removed (i.e., its thickness is reduced), and the second photoresist pattern portions 112 may be etched so that their thickness decreases by a predetermined amount. The etching method should be performed under the conditions that the gate insulating layer 30 is not substantially etched. It is preferable that the thickness of the second photoresist pattern 112 is large enough to prevent the underlying data wiring 62, 64, 65, 66, 68 from being exposed when etched.

As a result, the source electrodes 65 and the drain electrodes 66 are separated from each other, thereby completing the data wiring 62, 64, 65, 66, 68 and the underlying ohmic contact patterns 55, 56, 58.

Finally, the second photoresist pattern portion 112 remaining at the data wiring area E is removed. Alternatively, the second photoresist pattern portion 112 can be removed before removing the underlying intermediate layer pattern 57 after removing the source/drain conductive pattern 67 at the channel portion C.

As described above, the wet etching method and the dry etching method can be alternately used, or only the dry etching method can be used. In the latter case, the process is simple but it is relatively difficult to find the proper etching conditions. Contrary, in the former case, it is relatively easy to find the proper etching conditions, but the process is complicated.

Figure 26A:
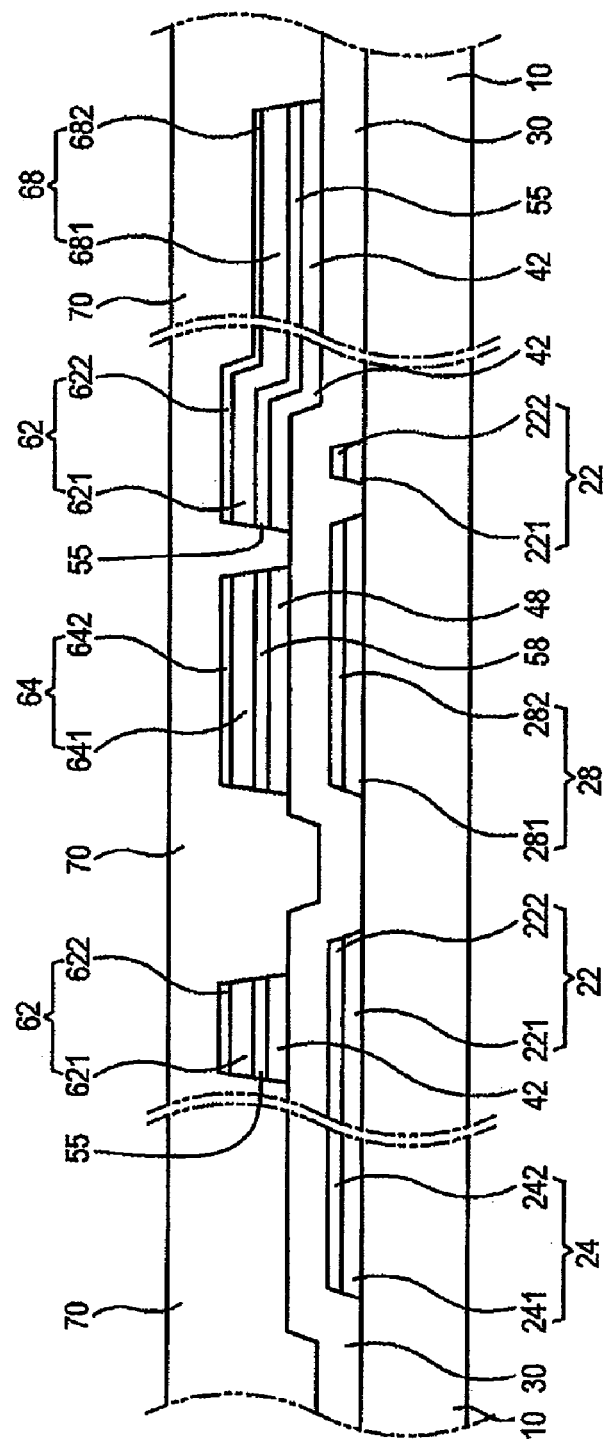
Figure 26B:
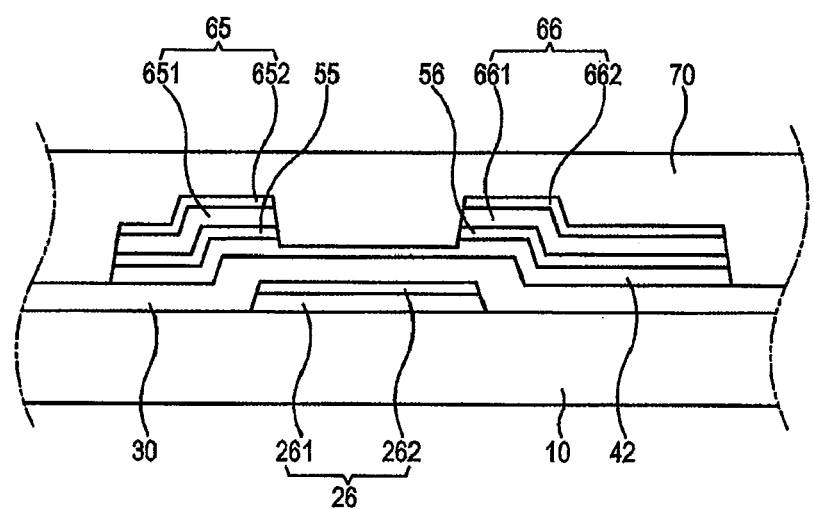

As shown in FIGS. 26A to 26B, the passivation layer 70 is formed by growing silicon nitride, a-Si:C:O layer or a-Si:O:F layer through the CVD method, or applying an organic insulating film.

Figure 27A:
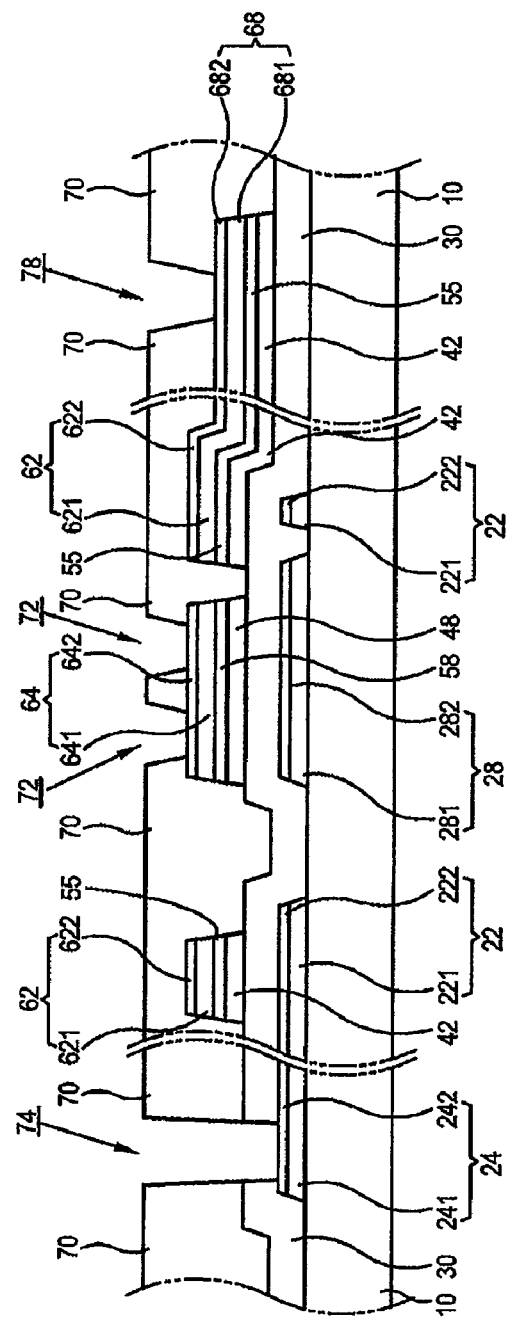
Figure 27B:
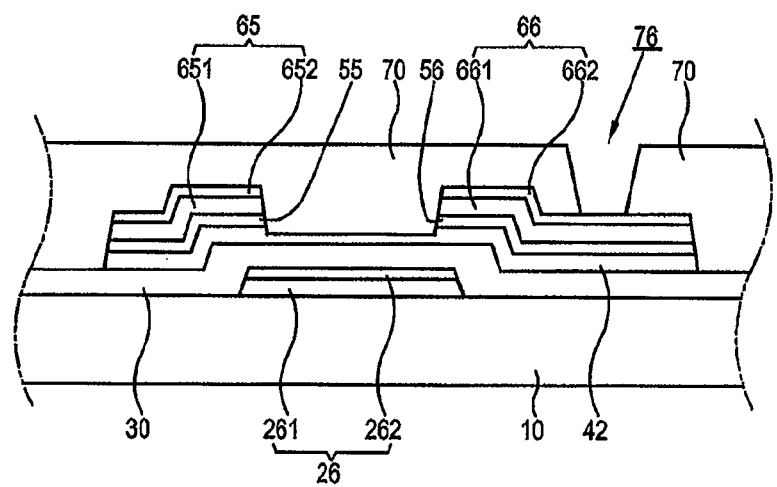
Figure 28:
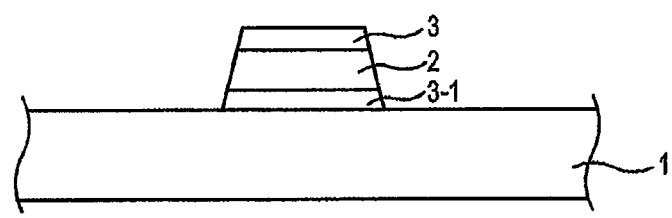
FIG. 28 is a cross sectional view showing a wiring having a bottom molybdenum layer.

Referring to FIGS. 27A and 27B, the passivation layer 70, together with the gate insulating layer 30, is etched to form contact holes 76, 74, 78, 72 through which the drain electrodes 66, the end portion 24 of the gate line, the end portion 68 of the data line, and the storage capacitor conductive pattern 64 are exposed, respectively.

Finally, referring to FIGS. 18 and 19, the ITO layer or the IZO layer having a thickness of about 400 Å to about 500 Å is deposited and etched to form the pixel electrode 82 connected to the drain electrode 66 and the storage capacitor conductive pattern 64, and to form the contact subsidiary data part 88 connected to the end portion 24 of the gate line and the contact subsidiary gate part 86 connected to the end portion 68 of the data line.

Meanwhile, nitrogen gas can be used in a pre-heating process performed before depositing the ITO or IZO layer. The nitrogen gas prevents the oxidation of the metal layer 24, 64, 66, 68 exposed through the contact holes 72, 74, 76, 78 respectively.

According to the second embodiment of the present invention, the data wiring 62, 64, 65, 66, 68, the underlying ohmic contact patterns 55, 56, 58 and the semiconductor patterns 42 and 48 are etched using one mask, and at the same time, the source and drain electrodes 65 and 66 are separated from each other, thereby simplifying the fabricating process.

The foregoing embodiments may vary. For example, the top molybdenum layer may include one of tungsten (W), zirconium (Zr), tantalum (Ta), niobium (Nb), and nitrogen (N). Additionally, a bottom molybdenum layer may be formed on a bottom of the aluminum layer, thereby forming a wiring having a triple layer structure.

Alternatively, the TFT array panel according to an embodiment of the present invention can be used in not only a TFT LCD but also an organic light emitting diode (OLED) apparatus (or the like).

An OLED uses an organic material that emits light in response to a received electric signal (e.g., a data signal indicative of display data). An OLED may have a layered structure comprising an anode layer (pixel electrode), a hole injecting layer, a hole transporting layer, an emission layer, an electron transporting layer, an electron injection layer, and a cathode layer (counter electrode). According to an embodiment of the present invention, the drain electrode of the TFT array panel is electrically connected to the anode layer, thereby transmitting the data signal. On the other hand, the drain electrode of the TFT substrate is electrically connected to the cathode layer.

As described above, embodiments of the present invention provides a TFT array panel comprising an aluminum wiring having an improved structure for reducing or eliminating hillock formation, and a fabricating method thereof.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A method of fabricating a TFT array panel, comprising:
   depositing an aluminum layer having a first thickness directly on a substrate;
   depositing a top molybdenum layer on the aluminum layer, the top molybdenum layer having a second thickness about 20% to about 27% the first thickness;
   forming a wiring by patterning the aluminum layer and the top molybdenum layer and
   forming an insulating layer, a semiconductor layer, and an ohmic contact layer in sequence on the wiring,
   wherein the aluminum layer has a standard reduction potential of −1.76V, and the top molybdenum layer has a standard reduction potential of −0.2V and further wherein the aluminum layer has a taper shape, and
   wherein the forming an insulating layer, a semiconductor layer, and an ohmic contact layer in sequence further comprises forming at least one of the insulating layer, the semiconductor layer, and the ohmic contact layer using a plasma-enhanced chemical vapor deposition process.

2. The method according to claim 1, wherein the top molybdenum layer has a taper shape.

3. The method according to claim 1, wherein the thickness of the top molybdenum layer is between about 200 and about 1500 Å.

* * * * *